(12) United States Patent
Morie et al.

(10) Patent No.: US 12,008,338 B2
(45) Date of Patent: Jun. 11, 2024

(54) MULTIPLY-ACCUMULATE OPERATION DEVICE, MULTIPLY-ACCUMULATE OPERATION CIRCUIT, MULTIPLY-ACCUMULATE OPERATION SYSTEM, AND MULTIPLY-ACCUMULATE OPERATION METHOD

(71) Applicant: Sony Group Corporation, Tokyo (JP)

(72) Inventors: Takashi Morie, Fukuoka (JP); Masatoshi Yamaguchi, Fukuoka (JP); Goki Iwamoto, Fukuoka (JP); Hakaru Tamukoh, Fukuoka (JP)

(73) Assignee: Sony Group Corporation, Tokyo (JP)

( * ) Notice: Subject to any disclaimer, the term of this patent is extended or adjusted under 35 U.S.C. 154(b) by 725 days.

(21) Appl. No.: 17/258,328

(22) PCT Filed: Jul. 4, 2019

(86) PCT No.: PCT/JP2019/026603
§ 371 (c)(1),
(2) Date: Jan. 6, 2021

(87) PCT Pub. No.: WO2020/013069
PCT Pub. Date: Jan. 16, 2020

(65) Prior Publication Data
US 2021/0294573 A1 Sep. 23, 2021

(30) Foreign Application Priority Data
Jul. 13, 2018 (JP) ................................ 2018-133750

(51) Int. Cl.
*G06F 7/544* (2006.01)
*G06F 7/523* (2006.01)
(Continued)

(52) U.S. Cl.
CPC ............ *G06F 7/5443* (2013.01); *G06F 7/523* (2013.01); *G06N 3/063* (2013.01); *H03K 19/01728* (2013.01); *H03K 19/0806* (2013.01)

(58) Field of Classification Search
CPC . G11C 11/54; G06F 7/50; G06F 7/523; G06F 7/5443; G06F 17/153; G06F 17/16;
(Continued)

(56) References Cited

U.S. PATENT DOCUMENTS 9,779,355 B1 * 10/2017 Leobandung ............ G06N 3/04
2015/0269483 A1 9/2015 Nishitani et al.
(Continued)

FOREIGN PATENT DOCUMENTS

| CN | 1867888 A | 11/2006 |
|---|---|---|
| JP | 07-141313 A | 6/1995 |

(Continued)

OTHER PUBLICATIONS

M. Yamaguchi et al., An Energy-efficient Time-domain Analog CMOS BinaryConnect Neural Network Processor Based on a Pulse-width Modulation Approach, IEEE Access Multidisciplinary Rapid Review Open Access Journal, 2017 (Year: 2017).*
(Continued)

*Primary Examiner* — Emily E Larocque
(74) *Attorney, Agent, or Firm* — Michael Best & Friedrich LLP

(57) ABSTRACT

A multiply-accumulate operation device, circuit and method are disclosed. In on example, a multiply-accumulate operation device includes input lines, multiplication units, an accumulation unit, a charging unit, and an output unit. Pulse signals having pulse widths corresponding to input values are input to the input lines. The multiplication units generate, based on the pulse signals, charges corresponding to multiplication values obtained by multiplying the input values by weight values. The accumulation unit accumulates a sum of the charges corresponding to the multiplication values. The charging unit charges the accumulation unit at a charging speed associated with its accumulation state. The output unit outputs a multiply-accumulate signal representing a sum of the multiplication values by executing threshold determination using a threshold value associated with the accumulation state of the accumulation unit on a voltage
(Continued)

held by the accumulation unit after the charging by the charging unit is started.

18 Claims, 18 Drawing Sheets

(51) Int. Cl.
  *G06N 3/063* (2023.01)
  *H03K 19/017* (2006.01)
  *H03K 19/08* (2006.01)

(58) Field of Classification Search
  CPC ............ G06G 7/14; G06G 7/16; G06N 3/065; G06N 3/049
  See application file for complete search history.

(56) References Cited

U.S. PATENT DOCUMENTS

| | | |
|---|---|---|
| 2018/0101359 A1 | 4/2018 | Harada |
| 2018/0181708 A1 | 6/2018 | Van Rooyen |
| 2018/0253643 A1* | 9/2018 | Buchanan ............. G06F 7/5443 |

FOREIGN PATENT DOCUMENTS

| | | |
|---|---|---|
| JP | 2005122466 A | 5/2005 |
| JP | 2010-061428 A | 3/2010 |
| JP | 2015-195011 A | 11/2015 |
| WO | WO-2018034163 A1 | 2/2018 |

OTHER PUBLICATIONS

Mohammad Bavandpour et al: "Energy-EEicient Time-Domain Vector-by-Matrix Multiplier for Neurocomputing and Beyond", Nov. 29, 2017 (Nov. 29, 2017), pp. 1-6,XP055662657,Retrieved from the Internet:URL: https://arxiv.org/pdf/1711.10673.pdf [retrieved on Jan. 28, 2020] * p. 1-p. 3 *.

International Search Report (PCT/ISA/210), International Application No. PCT/JP2019/026603, dated Aug. 30, 2019.

Written Opinion of the International Search Authority (PCT/ISA/237), International Application No. PCT/JP2019/026603, dated Aug. 30, 2019.

Notification of Transmittal of the International Search Report and the Written Opinion of the International Searching Authority, or the Declaration (PCT/ISA/220), International Application No. PCT/JP2019/026603, dated Sep. 10, 2019.

* cited by examiner

Input period

MULTIPLY-ACCUMULATE OPERATION DEVICE, MULTIPLY-ACCUMULATE OPERATION CIRCUIT, MULTIPLY-ACCUMULATE OPERATION SYSTEM, AND MULTIPLY-ACCUMULATE OPERATION METHOD

TECHNICAL FIELD

The present technology relates to a multiply-accumulate operation device, a multiply-accumulate operation circuit, a multiply-accumulate operation system, and a multiply-accumulate operation method that are applicable to a multiply-accumulate operation using an analog system.

BACKGROUND ART

For example, Patent Literature 1 describes an analog circuit in which processing of a multiply-accumulate operation is performed by an analog system. In this analog circuit, a weight corresponding to each of a plurality of electrical signals is set. Further, charges corresponding to the product of the corresponding electrical signal and the weight are output, and the output charges are appropriately accumulated in a capacitor. Then, a signal representing the multiply-accumulate result is calculated on the basis of the voltage of the capacitor in which charges are accumulated. As a result, the power consumed by the multiply-accumulate operation can be reduced as compared with processing using a digital system, for example (paragraphs [0003], to [0053], and [0062] of the specification and FIG. 4 of Patent Literature 1, etc.).

CITATION LIST

Patent Literature

Patent Literature 1: WO 2018/034163

DISCLOSURE OF INVENTION

Technical Problem

The use of such a circuit using an analog system is expected to lead to lower power consumption of devices that calculate neural network models or the like, and there is a need for a technology capable of improving the accuracy of a multiply-accumulate operation.

In view of the circumstances as described above, it is an object of the present technology to provide a multiply-accumulate operation device, a multiply-accumulate operation circuit, a multiply-accumulate operation system, and a multiply-accumulate operation method that are capable of improving the accuracy of an operation in an analog system of performing a multiply-accumulate operation.

Solution to Problem

In order to achieve the above-mentioned object, a multiply-accumulate operation device according to an embodiment of the present technology is a multiply-accumulate operation device that executes a multiply-accumulate operation with an analog circuit and includes: a plurality of input lines; a plurality of multiplication units; an accumulation unit; a charging unit; and an output unit.

Pulse signals having pulse widths corresponding to input values are input to the plurality of input lines.

The plurality of multiplication units generates, on the basis of the pulse signals input to each of the plurality of input lines, charges corresponding to multiplication values obtained by multiplying the input values by weight values.

The accumulation unit accumulates a sum of the charges corresponding to the multiplication values generated by each of the plurality of multiplication units.

The charging unit charges, at a charging speed associated with an accumulation state of the accumulation unit, the accumulation unit in which the sum of the charges corresponding to the multiplication values have been accumulated.

The output unit outputs a multiply-accumulate signal representing a sum of the multiplication values by executing threshold determination using a threshold value associated with the accumulation state of the accumulation unit on a voltage held by the accumulation unit after the charging by the charging unit is started.

In this multiply-accumulate operation device, the charging speed of charging the accumulation unit and the threshold value used to output a multiply-accumulate signal representing the sum of multiplication values are set in association with the accumulation state of the accumulation unit. As a result, it is possible to improve the resolution to express the result of the multiply-accumulate operation, and improve the accuracy of the operation.

The pulse signal may be input to each of the plurality of input lines within an input period having a predetermined length. In this case, the charging unit may start the charging after the input period is ended. Further, the output unit may also output the multiply-accumulate signal on the basis of timing at which the voltage held by the accumulation unit increases (or decreases) over the threshold value within an output period having a predetermined length.

The charging speed and the threshold value may be set on the basis of an effective maximum value and an effective minimum value of the sum of the charges corresponding to the multiplication values, the effective maximum value and the effective minimum value being obtained from an estimation result of the sum of the charges corresponding to the multiplication values accumulated by the accumulation unit.

The charging speed and the threshold value may be set so that a range from the effective maximum value to the effective minimum value is a range in which the multiply-accumulate signal can be output in the output period.

The timing at which the voltage held by the accumulation unit increases (or decreases) over the threshold value is used as calculation timing for calculating the multiply-accumulate signal, and the charging speed and the threshold value may be set so that the calculation timing corresponding to the effective maximum value is timing immediately after start timing of the output period and the calculation timing corresponding to the effective minimum value is timing immediately before end timing of the output period.

The charging speed and the threshold value may be set on the basis of a length of the output period.

The effective maximum value and the effective minimum value may be respectively a theoretical maximum value and a theoretical minimum value obtained from a theoretical value of the sum of the charges corresponding to the multiplication values accumulated by the accumulation unit.

The length of the output period may be equal to a length of the input period.

The charging unit may start the charging at end timing of the input period. In this case, the output period may be started at start timing of the charging by the charging unit.

The plurality of multiplication units may include a positive weight multiplication unit that generates positive weight charges corresponding to a multiplication value obtained by multiplying the input value by a positive weight value, and a negative weight multiplication unit that generates negative weight charges corresponding to a multiplication value obtained by multiplying the input value by a negative weight value. In this case, the accumulation unit may include a positive charge accumulation unit that accumulates a sum of the positive weight charges generated by the positive weight multiplication unit, and a negative charge accumulation unit that accumulates a sum of the negative weight charges generated by the negative weight multiplication unit. Further, the charging unit may charge the positive charge accumulation unit and the negative charge accumulation unit at the same charging speed. Further, the output unit may output the multiply-accumulate signal by executing threshold determination using the same threshold value on the positive charge accumulation unit and the negative charge accumulation unit.

The accumulation unit may accumulate charges corresponding to a difference between a total amount of positive weight charges corresponding to the multiplication value obtained by multiplying the input value by a positive weight value and a total amount of negative weight charges corresponding to the multiplication value obtained by multiplying the input value by a negative weight value.

The positive weight charges and the negative weight charges may be charges with the same sign as each other. In this case, the accumulation unit may accumulate a sum of the positive weight charges and discharge a sum of the negative weight charges.

The pulse signal may have a pulse width corresponding to a period from timing corresponding to the input value in the input period to end timing of the input period.

The multiply-accumulate operation device may further include one or more output lines. In this case, the plurality of multiplication units may be provided corresponding to the plurality of input lines. Further, each of the plurality of multiplication units may include a resistor that defines the weight value and has non-linear characteristics, the resistor being connected between the corresponding input line of the plurality of input lines and any one of the one or more output lines, and may output the charges corresponding to the multiplication values to the output line to which the resistor is connected.

The multiply-accumulate operation device may further include a positive charge output line and a negative charge output line. In this case, the plurality of multiplication units may be provided corresponding to the plurality of input lines. Further, the positive weight multiplication unit may include a resistor that defines the positive weight value and has non-linear characteristics, the resistor being connected between the corresponding input line of the plurality of input lines and the positive charge output line, and may output positive weight charges corresponding to the multiplication value to the positive charge output line. Further, the negative weight multiplication unit may include a resistor that defines the negative weight value and has non-linear characteristics, the resistor being connected between the corresponding input line of the plurality of input lines and the negative charge output line, and may output negative weight charges corresponding to the multiplication value to the negative charge output line.

The resistor may be a fixed resistance element, a variable resistance element, or a MOS transistor that operates in a subthreshold region.

A multiply-accumulate operation circuit according to an embodiment of the present technology is a multiply-accumulate operation circuit that executes a multiply-accumulate operation by an analog system, and include the plurality of input lines, the plurality of multiplication units, the accumulation unit, the charging unit, and the output unit.

A multiply-accumulate operation system according to an embodiment of the present technology includes the plurality of input lines and a network circuit including a plurality of analog circuits.

The plurality of analog circuits includes the plurality of multiplication units, the accumulation unit, the charging unit, and the output unit.

A multiply-accumulate operation method according to an embodiment of the present technology includes inputting pulse signals having pulse widths corresponding to input values to a plurality of input lines. On the basis of the pulse signals input to each of the plurality of input lines, charges corresponding to multiplication values obtained by multiplying the input values by weight values are generated.

A sum of the generated charges corresponding to the multiplication values is accumulated in an accumulation unit.

The accumulation unit in which a sum of the charges corresponding to the multiplication values is accumulated is charged at a charging speed associated with an accumulation state of the accumulation unit.

A multiply-accumulate signal representing a sum of the multiplication values is output by executing threshold determination using a threshold value associated with the accumulation state of the accumulation unit on a voltage held by the accumulation unit after the charging is started.

Advantageous Effects of Invention

As described above, in accordance with the present technology, it is possible to improve the accuracy of an operation in the analog system of performing a multiply-accumulate operation. Note that the effects described here are not necessarily limitative, and any of the effects described in the present disclosure may be provided.

MODE(S) FOR CARRYING OUT THE INVENTION

Hereinafter, embodiments according to the present technology will be described with reference to the drawings.

First Embodiment

[Configuration of Multiply-Accumulate Operation Device]

Figure 1:
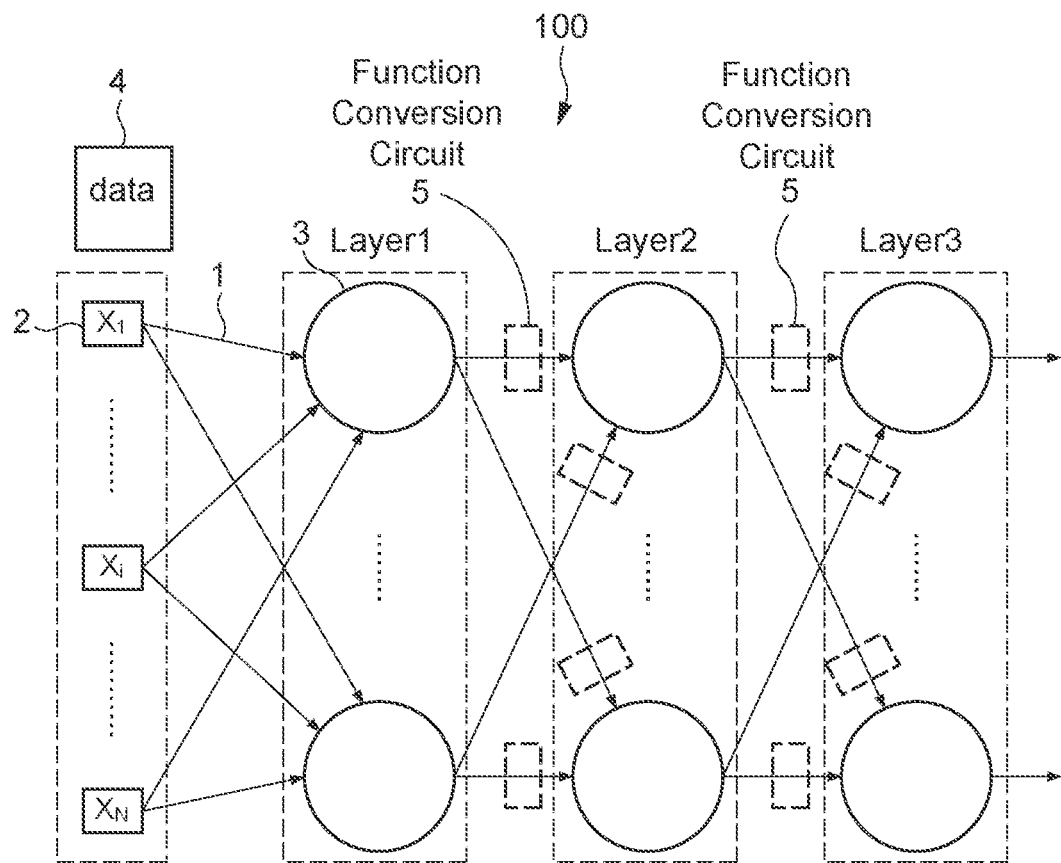
FIG. 1 is a schematic diagram showing a configuration example of an arithmetic logic unit including a multiply-accumulate operation device according to a first embodiment.

FIG. 1 is a schematic diagram showing a configuration example of an arithmetic logic unit including a multiply-accumulate operation device according to a first embodiment of the present technology. An arithmetic logic unit 100 is an arithmetic logic unit using an analog system, which executes predetermined arithmetic processing including a multiply-accumulate operation. The arithmetic logic unit 100 is capable of executing arithmetic processing according to a mathematical model.

The arithmetic logic unit 100 includes a plurality of signal lines 1, a plurality of input units 2, and a plurality of multiply-accumulate operation devices 3. Each of the signal lines 1 is a line that transmits an electrical signal of a predetermined method. As the electrical signal, for example, an analog signal representing a signal value using an analog amount such as the timing and width of the pulse is used. The directions in which electrical signals are transmitted are schematically illustrated in FIG. 1 by means of arrows.

For example, the plurality of signal lines 1 is connected to one multiply-accumulate operation device 3. The signal line 1 that transmits the electrical signal to the multiply-accumulate operation device 3 is an input signal line to which the electrical signal is input for the multiply-accumulate operation device 3 to which the signal line 1 is connected. Further, the signal line 1 that transmits the electrical signal output from the multiply-accumulate operation device 3 is an output signal line to which the electrical signal is output for the multiply-accumulate operation device 3 that outputs the electrical signal. In this embodiment, the input signal line corresponds to the input line.

Each of the plurality of input units 2 generates a plurality of electrical signals corresponding to input data 4. The input data 4 is, for example, data to be processed using a neural network or the like implemented by the arithmetic logic unit 100. Therefore, it can also be said that the respective signal values of the plurality of electrical signals according to the input data 4 are input values to the arithmetic logic unit 100.

As the input data 4, for example, arbitrary data such as image data, audio data, and statistical data to be processed by the arithmetic logic unit 100 is used. For example, in the case where image data is used as the input data 4, an electrical signal having a signal value corresponding to the pixel value (RGB value, luminance value, etc.) of each of the pixels of the image data is generated. In addition, an electrical signal corresponding to the input data 4 may be appropriately generated in accordance with the type of the input data 4 and the content of the processing by the arithmetic logic unit 100.

The multiply-accumulate operation device 3 is a multiply-accumulate operation circuit using an analog system, which performs a multiply-accumulate operation on the basis of the input electrical signal. The multiply-accumulate operation is an operation of adding a plurality of multiplication values obtained by multiplying each of a plurality of input value by weight values. Therefore, it can also be said that the multiply-accumulate operation is processing of calculating the sum (hereinafter, referred to as the multiply-accumulate result) of the respective multiplication values.

As shown in FIG. 1, a plurality of input signal line is connected to one multiply-accumulate operation device 3 to provide a plurality of electrical signals. In this embodiment, the total number of electrical signals input to one multiply-accumulate operation device 3 is N. Note that the number N of the electrical signals to be input to each of the multiply-accumulate operation devices 3 is appropriately set for each of the circuits in accordance with, for example, the model, accuracy, and the like of arithmetic processing.

In the multiply-accumulate operation device 3, for example, $w_i \cdot x_i$ that is a multiplication value of a signal value (input value) $x_i$ represented by an electrical signal input from the i-th input signal line and a weight value $w_i$ corresponding to the signal value $x_i$ is calculated. Here, i is a natural number equal to or less than N (i=1, 2, . . . , N). The operation of the multiplication value is executed for each electrical signal (input signal line) and N multiplication values are calculated. The sum of the N multiplication values is calculated as a multiply-accumulate result (sum of the N multiplication values). Therefore, the multiply-accumulate result calculated by one multiply-accumulate operation device 3 is expressed by the following formula.

$$\sum_{i=1}^{N} W_i \cdot X_i \quad \text{[Math. 1]}$$

The weight value $w_i$ is set in the range of, for example, $-\alpha \leq w_i \leq +\alpha$. Here, α represents an arbitrary real value. Therefore, the weight value $w_i$ includes a positive weight value $w_i$, a negative weight value $w_i$, the weight value $w_i$ that is zero, or the like.

Further, for example, the range in which the weight value $w_i$ is set may be normalized. In this case, the weight value $w_i$ is set within the range of $-1 \leq w_i \leq 1$. As a result, for example, the maximum value, the minimum value, and the like of the multiply-accumulate result can be adjusted, and a multiply-accumulate operation can be executed with desired accuracy.

In a neural network or the like, a method called binary connection, which sets the weight value $w_i$ to either $+\alpha$ or $-\alpha$, can be used. The binary connection is capable of simplifying the setting of the weight value $w_i$ without deteriorating the recognition accuracy or the like by, for example, using it in the field of image recognition using a deep neural network (multi-layer neural network), or the like.

As described above, in the binary connection, the weight value $w_i$ is binarized to binary values ($\pm\alpha$). Therefore, for example, by switching the positive and negative of the weight value $w_i$, it is possible to easily set a desired weight value $w_i$. Further, the binarized weight value $w_i$ may be normalized to set the weight value $w_i$ to $\pm 1$. In addition, the setting range, value, and the like of the weight value $w_i$ are not limited, and may be appropriately set so that, for example, desired processing accuracy is realized.

Note that the target signal value $x_i$ of the multiply-accumulate operation is, for example, a value represented by an electrical signal output from each of the input units 2, or a multiply-accumulate result output from each of the multiply-accumulate operation devices 3. Therefore, it can be also said that each of the input units 2 and the multiply-accumulate operation devices 3 functions as a signal source that outputs the signal value $x_i$.

In the example shown in FIG. 1, a single electrical signal (single signal value $x_i$) is output from one signal source (the input unit 2, the multiply-accumulate operation device 3). Therefore, the same electrical signal is input to the plurality of signal lines 1 connected to the output side of the one signal source. Further, one signal source and the multiply-accumulate operation device 3 to which the electrical signal output from the signal source is input are connected to each other by a single input signal line.

Therefore, for example, in the case where M signal sources are connected to the multiply-accumulate operation device 3, M input signal lines are connected to the multiply-accumulate operation device 3. Then, the total number of electrical signals input to the multiply-accumulate operation device 3 is M. Note that in the arithmetic logic unit 100 shown in FIG. 1, N=M. Note that a pair of positive and negative electrical signals (a pair of signal values $x_i^+$ and $x_i^-$) may be output from one signal source.

As shown in FIG. 1, the arithmetic logic unit 100 has a hierarchical structure in which the plurality of multiply-accumulate operation devices 3 is provided in each of a plurality of layers. By configuring the layer structure of the multiply-accumulate operation devices 3, for example, a multi-layer perceptron type neural network or the like is constructed. For example, a multiply-accumulate operation system can be constructed by connecting the plurality of multiply-accumulate operation devices 3 to each other to obtain a network circuit. The number of the multiply-accumulate operation devices 3 provided in each layer, the number of layers, and the like are appropriately designed so that, for example, desired processing can be executed. In the following, the number of the multiply-accumulate operation devices 3 provided in the layer of the j-th stage will be referred to as N in some cases.

For example, N electrical signals generated by N input units 2 are input to each of the multiply-accumulate operation devices 3 provided in the layer of the first stage (the lowest layer). Each of the multiply-accumulate operation devices 3 in the first stage calculates the multiply-accumulate result relating to the signal value $x_i$ of the input data, and the calculated multiply-accumulate result is subjected to non-linear transformation processing and then output to the multiply-accumulate operation devices 3 provided in the next layer (second stage).

$N_1$ electrical signals representing the multiply-accumulate results calculated in the first stage are input to the respective multiply-accumulate operation devices 3 provided in the second layer (upper layer). Therefore, each of the multiply-accumulate results calculated in the first stage when viewed from each of the multiply-accumulate operation devices 3 in the second stage is the signal value $x_i$ of the electrical signal. The multiply-accumulate result relating to the signal value $x_i$ output from the first stage is calculated by the multiply-accumulate operation device 3 in the second stage, subjected to non-linear transformation processing, and then output to the multiply-accumulate operation device 3 in the upper layer.

In this way, in the arithmetic logic unit 100, the multiply-accumulate result of the multiply-accumulate operation device 3 in the upper layer is calculated on the basis of the multiply-accumulate result calculated by the multiply-accumulate operation device 3 in the lower layer and the result of the subsequent non-linear transformation processing. Such processing is executed a plurality of times, and the processing result is output from the multiply-accumulate operation device 3 included in the top layer (the layer of the third stage in FIG. 1). As a result, for example, processing such as image recognition of determining that the object is a cat on the basis of image data (the input data 4) obtained by imaging the cat can be performed.

Note that the method of connecting the multiply-accumulate operation devices 3 to each other, and the like are not limited, and, for example, the plurality of multiply-accumulate operation devices 3 may be appropriately connected to each other so that desired processing can be performed. For example, the present technology is applicable even in the case where the multiply-accumulate operation devices 3 are connected to each other so as to constitute another structure different from the hierarchical structure.

In the above-mentioned neural network model, processing such as performing non-linear conversion on the multiply-accumulate result of each of the multiply-accumulate operation devices 3 using an activation function, and inputting the conversion result to the upper layer is performed.

In the arithmetic logic unit 100, for example, a function conversion circuit 5 that performs non-linear transformation by an activation function on the electrical signal is used. The function conversion circuit 5 is, for example, a circuit that is provided between a lower layer and an upper layer, appropriately converts a signal value of an electrical signal to be input, and outputs an electrical signal according to a result of the conversion. The function conversion circuit 5 is provided for each of the signal lines 1, for example. The number, arrangement, and the like of the function conversion circuits 5 are appropriately set in accordance with, for example, the mathematical model implemented in the arithmetic logic unit 100.

As the activation function, for example, a ReLU function (ramp function) or the like is used. In the ReLU function, the signal value $x_i$ is output as it is in the case where, for example, the signal value $x_i$ is 0 or more, and 0 is output in other cases.

Figure 2:
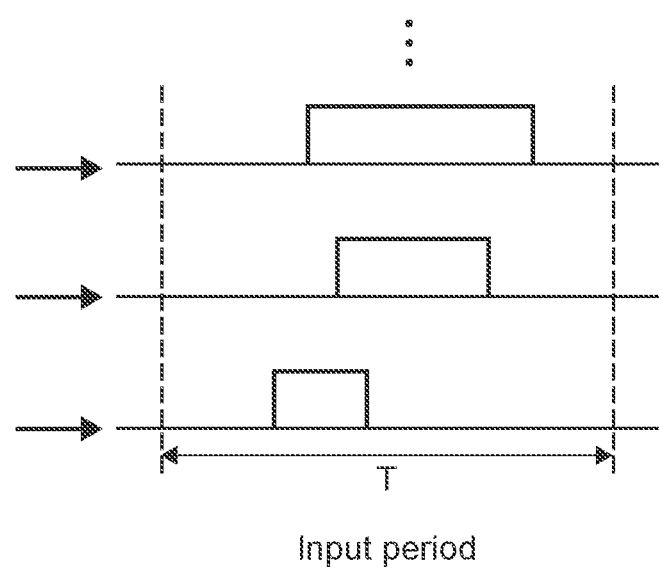
FIG. 2 is a schematic diagram showing an example of an electrical signal input to the multiply-accumulate operation device.

FIG. 2 is a schematic diagram showing an example of the electrical signal input to the multiply-accumulate operation devices 3. FIG. 2 schematically illustrates a graph representing waveforms of a plurality of electrical signals input to one multiply-accumulate operation device 3. The horizontal axis of the graph represents the time axis, and the vertical axis represents the voltage of the electrical signal. Note that the time axis of each graph is common.

In this embodiment, an electrical signal using a pulse width modulation (PWM) system is used. The PWM system is, for example, a method of representing the signal value $x_i$ using a pulse width Ti of a pulse waveform. That is, in the PWM system, the pulse width $\tau_1$ of the electrical signal is a length corresponding to the signal value $x_i$. Typically, the longer pulse width $\tau_1$ represents the larger signal value $x_i$.

Further, the electrical signal is input to the multiply-accumulate operation device 3 during a predetermined input period T. More specifically, the respective electrical signals are input to the multiply-accumulate operation devices 3 so that the pulse waveforms of the electrical signals fall within the input period T. Therefore, the maximum value of the pulse width of the electrical signal is the same as the input period T. Note that the timing at which the respective pulse waveforms (electrical signals) are input, and the like are not limited as long as the pulse waveforms fall within the input period T.

In the PWM system, for example, a duty ratio $R_1$ ($=\tau_1/T$) of the pulse width $\tau_1$ to the input period T can be used to normalize the signal value $x_i$. That is, the normalized signal value $x_i$ is represented as the signal value $x_i=R_1$. Note that the method of associating the signal value $x_i$ and the pulse width $\tau_1$ with each other is not limited. For example, the pulse width $\tau_1$ representing the signal value $x_i$ may be appropriately set so that arithmetic processing or the like can be performed with desired accuracy. In the following, description will be made assuming that the signal value $x_i$ represented by each electrical signal is a variable of 0 or more and 1 or less.

The multiply-accumulate operation devices 3 according to this embodiment can also be referred to as PWM multiply-accumulate operation devices 3. In this embodiment, a time-axis analog multiply-accumulate operation using the PWM multiply-accumulate operation devices 3 can be performed.

Figure 3:
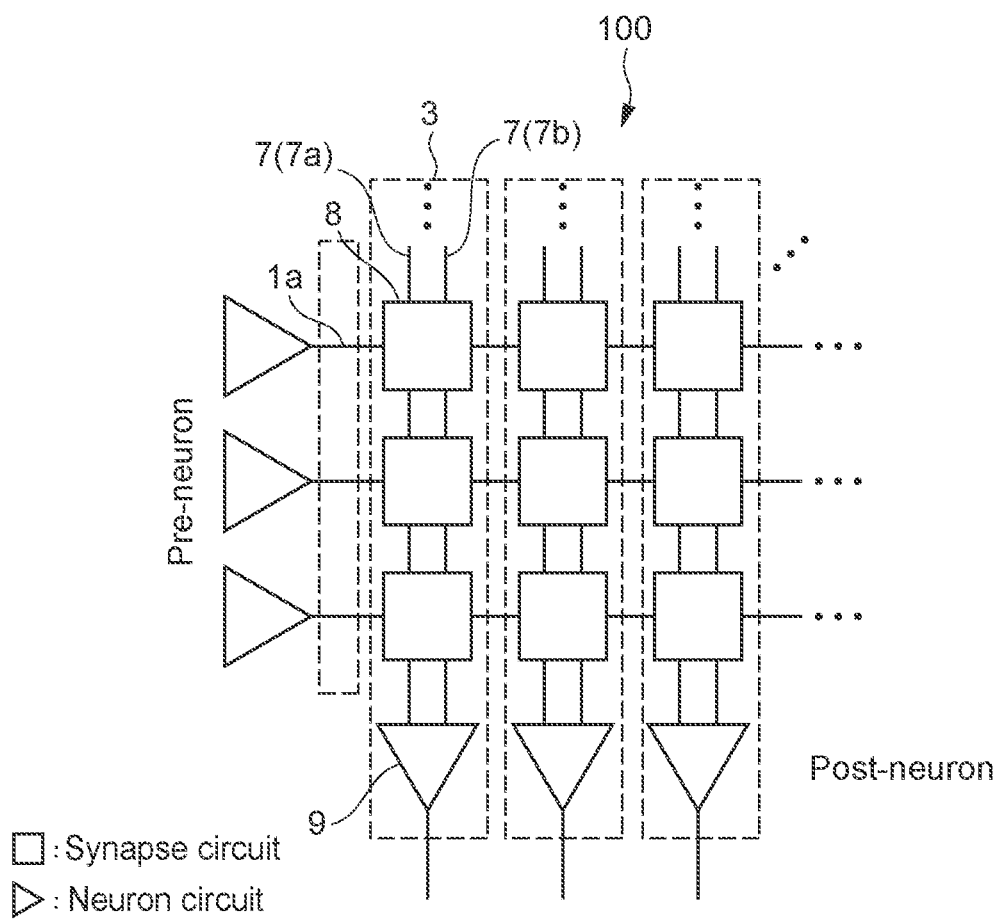
FIG. 3 is a schematic diagram showing a disposition example of the multiply-accumulate operation device for realizing an arithmetic logic unit.

FIG. 3 is a schematic diagram showing a disposition example of the multiply-accumulate operation devices 3 for realizing the arithmetic logic unit 100 shown in FIG. 1. In FIG. 3, the plurality of multiply-accumulate operation devices 3 provided in one layer is schematically illustrated.

The multiply-accumulate operation devices 3 each include a pair of output lines 7, a plurality of synapse circuits 8, and a neuron circuit 9. As shown in FIG. 3, one multiply-accumulate operation device 3 is configured to extend in a predetermined direction (longitudinal direction in the figure). A plurality of multiply-accumulate operation devices 3 extending in the longitudinal direction is arranged side by side in the lateral direction, thereby forming one hierarchy.

The pair of output lines 7 are spaced apart from each another along the extension direction of the multiply-accumulate operation devices 3. The pair of output lines 7 include a positive charge output line 7a and a negative charge output line 7b. Each of the positive charge output line 7a and the negative charge output line 7b is connected to the neuron circuit 9 via the plurality of synapse circuits 8.

The synapse circuit 8 calculates the multiplication value $w_i \cdot x_i$ of the signal value $x_i$ represented by the electrical signal and the weight value $w_i$. Specifically, charges (current) corresponding to the multiplication value are output to either the positive charge output line 7a or the negative charge output line 7b.

As will be described below, either a positive weight value $w_i^+$ or a negative weight value is set for the synapse circuit 8. For example, positive weight charges corresponding to the multiplication value with the positive weight value $w_i^+$ are output to the positive charge output line 7a. Further, for example, negative weight charges corresponding to the multiplication value with the negative weight value are output to the negative charge output line 7b.

Note that in the synapse circuit 8, charges of the same sign (e.g., positive charges) are output regardless of the positive and negative of the weight value $w_i$ as charges corresponding to the multiplication value. That is, positive weight charges and negative weight charges are charges of the same sign.

As described above, the synapse circuit 8 is configured to output charges corresponding to the multiplication result to the different output line 7a or 7b in accordance with the sign of the weight value $w_i$. A specific configuration of the synapse circuit 8 will be described below in detail. In this embodiment, the synapse circuit 8 corresponds to the multiplication unit.

In this embodiment, a single input signal line 1a and the pair of output lines 7 are connected to one synapse circuit 8. That is, a single electrical signal is input to one synapse circuit 8, and charges corresponding to the multiplication value calculated on the basis of the input electrical signal are output to one of the output lines 7a and 7b. In this way, the synapse circuit 8 is a one-input two-output circuit connected to the single input signal line 1a and the pair of output lines 7 (the positive charge output line 7a and the negative charge output line 7b).

In one multiply-accumulate operation device 3, the plurality of synapse circuits 8 is arranged along the pair of output lines 7. Each of the synapse circuits 8 is connected in parallel to the positive charge output line 7a (the negative charge output line 7b). Hereinafter, the synapse circuit 8 disposed on the most downstream side (the side connected to the neuron circuit 9) will be referred to as the first synapse circuit.

As shown in FIG. 3, the plurality of input signal lines 1a is arranged so as to cross the pair of output lines 7 of each of the plurality of multiply-accumulate operation devices 3. Typically, the input signal line 1a is disposed perpendicular to the respective output lines 7. That is, the arithmetic logic unit 100 has a crossbar configuration in which the input signal line 1a and the output line 7 cross each other. By using the crossbar configuration, for example, the multiply-accumulate operation devices 3 or the like can be integrated at high density.

Further, in the arithmetic logic unit 100, the j-th synapse circuit 8 included in each of the multiply-accumulate operation devices 3 is connected in parallel to the j-th input signal line 1a. Therefore, similar electrical signals are input to the synapse circuits 8 connected to the same input signal line 1a. As a result, a configuration as illustrated in FIG. 1 in which one signal source included in the lower layer is connected to the plurality of multiply-accumulate operation devices 3 included in the upper layer can be implemented.

Note that in the example shown in FIG. 3, the multiply-accumulate operation devices 3 (pre-neuron) included in the lower layer are schematically illustrated as a signal source that inputs an electrical signal to each of the input signal lines 1a. The present technology is not limited thereto, and for example, a crossbar configuration can be used even in the case where the input unit 2 as exemplified in FIG. 1 is used as the signal source.

As described above, in the arithmetic logic unit 100, the plurality of multiply-accumulate operation devices 3 is connected in parallel to each of the plurality of input signal lines 1a. As a result, for example, it is possible to input an electrical signal in parallel to each of the multiply-accumulate operation devices 3 (each of the synapse circuits 8), and speed up the arithmetic processing. As a result, it is possible to exhibit excellent operation performance.

The neuron circuit 9 calculates the multiply-accumulate result shown in the formula (Math. 1) on the basis of the multiplication value calculated by each of the synapse circuits 8. Specifically, an electrical signal representing the multiply-accumulate result is output on the basis of charges input via the pair of output lines 7.

Figure 4:
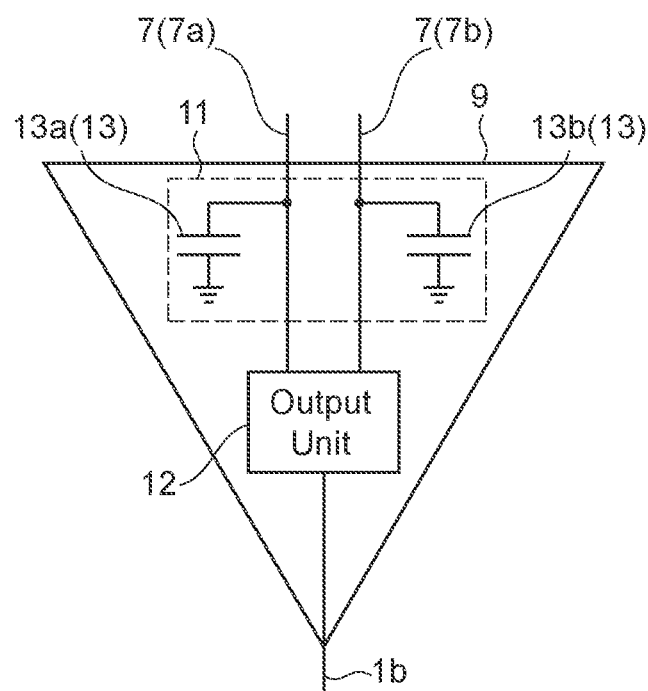
FIG. 4 is a schematic diagram showing a configuration example of a neuron circuit.

FIG. 4 is a schematic diagram showing a configuration example of the neuron circuit 9. FIG. 4 shows the two-input one-output neuron circuit 9 connected to the pair of output lines 7 and a single output signal line 1b. Note that a two-input two-output circuit or the like can be used as the neuron circuit 9 in some cases.

The neuron circuit 9 includes an accumulation unit 11 and an output unit 12. The accumulation unit 11 accumulates the sum of charges output to the pair of output lines 7 by the plurality of synapse circuits 8. The accumulation unit 11 includes two capacitors 13a and 13b. The capacitor 13a is connected between the positive charge output line 7a and a GND. Further, the capacitor 13b is connected between the negative charge output line 7b and a GND. Therefore, charges flowing in from the positive charge output line 7a and the negative charge output line 7b are respectively accumulated in the capacitors 13a and 13b.

For example, at the timing when the input period T of the electrical signal is ended, charges accumulated in the capacitor 13a are the total sum of positive weight charges corresponding to multiplication values of the signal value $x_i$ and the positive weight value $w_i^+$. Further, similarly, charges accumulated in the capacitor 13b are the total sum of negative weight charges corresponding to multiplication values of the signal value $x_i$ and the negative weight value $w_i^-$.

For example, when positive weight charges are accumulated in the capacitor 13a, the potential of the positive charge output line 7a with reference to the GND rises. Therefore, the potential of the positive charge output line 7a has a value corresponding to the total sum of positive weight charges. Note that the potential of the positive charge output line 7a corresponds to the voltage held by the capacitor 13a.

Similarly, when negative weight charges are accumulated in the capacitor 13b, the potential of the negative charge output line 7b with reference to the GND rises. Therefore, the potential of the negative charge output line 7b has a value corresponding to the total sum of negative weight charges. Note that the potential of the negative charge output line 7b corresponds to the voltage held by the capacitor 13b.

The output unit 12 outputs a multiply-accumulate signal representing the sum of the multiplication value $w_i \cdot x_i$ on the basis of charges accumulated in the accumulation unit 11. Here, the multiply-accumulate signal is, for example, a signal representing the entire multiply-accumulate result, which is the sum of multiplication values of all the positive and negative weight values $w_i$ and the signal value $x_i$. For example, the multiply-accumulate result represented by the above-mentioned (Math. 1) can be written as follows.

$$\sum_{i=1}^{N} w_i x_i = \sum_{i=1}^{N^+} w_i^+ x_i - \sum_{i=1}^{N^-} |w_i^-| x_i \qquad [\text{Math. 2}]$$

Here, $N^+$ and $N^-$ are respectively the total number of the positive weight values $w_i^+$ and the total number of the negative weight values Thus, the entire multiply-accumulate result can be calculated as the difference between the multiply-accumulate result of positive weight charges, which is the total sum of multiplication values $w_i^+ \cdot x_i$ with the positive weight value $w_i^+$, and the multiply-accumulate result of negative weight charges, which is the total sum of multiplication values $|w_i^-| \cdot x_i$ with the negative weight value $w_i^-$.

The output unit 12 generates, as a multiply-accumulate signal, one signal representing the entire multiply-accumulate result (the left side of the formula (Math. 2)), for example. Note that the present technology is not limited thereto, and the output unit 12 may be configured to generate, as the multiply-accumulate signal, two signals of a positive multiply-accumulate signal representing the multiply-accumulate result of positive weight charges and a negative multiply-accumulate signal representing the multiply-accumulate result of negative weight charges.

For example, the output unit 12 calculates the multiply-accumulate result of positive weight charges on the basis of the potential of the positive charge output line 7a (the voltage held by the capacitor 13a). Further, the output unit 12 calculates the multiply-accumulate result of negative weight charges on the basis of the potential of the negative charge output line 7b (the voltage held by the capacitor 13b). For example, in the example shown in FIG. 4, the entire multiply-accumulate result is calculated from the difference between the positive and negative multiply-accumulate results, and is output as one multiply-accumulate signal. Further, for example, positive and negative multiply-accumulate signals may be respectively output from the positive and negative multiply-accumulate results.

The method of generating a multiply-accumulate signal on the basis of charges accumulated in the accumulation unit 11 is not limited. As an example, a method of detecting charges accumulated in one capacitor 13 will be described. In the case where a PWM electrical signal is used, charges corresponding to the multiplication value is accumulated in the capacitor 13 during the input period T. That is, before and after the input period T, the accumulation of charges corresponding to the multiplication value does not occur.

For example, after the input period T is ended, capacitor 13 is charged at a predetermined charging speed. At this time, a comparator or the like is used to detect the timing when the potential of the output line to which the capacitor 13 is connected reaches a predetermined threshold potential. For example, the more charges at the time of starting charging, the earlier the timing when the potential reaches the threshold potential. Therefore, the charges (multiply-accumulate results) accumulated during the input period T can be represented on the basis of the timing. Note that the charging speed can be expressed by, for example, a charge amount per unit time, and can also be referred to as a charging rate.

Note that this threshold determination corresponds to increasing the voltage held by the capacitor 13 by charging, and detecting the timing of reaching the threshold voltage.

As described above, by charging the accumulation unit 11 (the capacitors 13a and 13b) after the input period T is ended, the timing representing the multiply-accumulate result is detected. The multiply-accumulate signal of positive weight charges, the multiply-accumulate signal of negative weight charges, or the entire multiply-accumulate signal is appropriately generated on the basis of the detection result. In addition, for example, the potential of the capacitor 13 can be directly read to calculate the multiply-accumulate results after the input period T.

Figure 5:
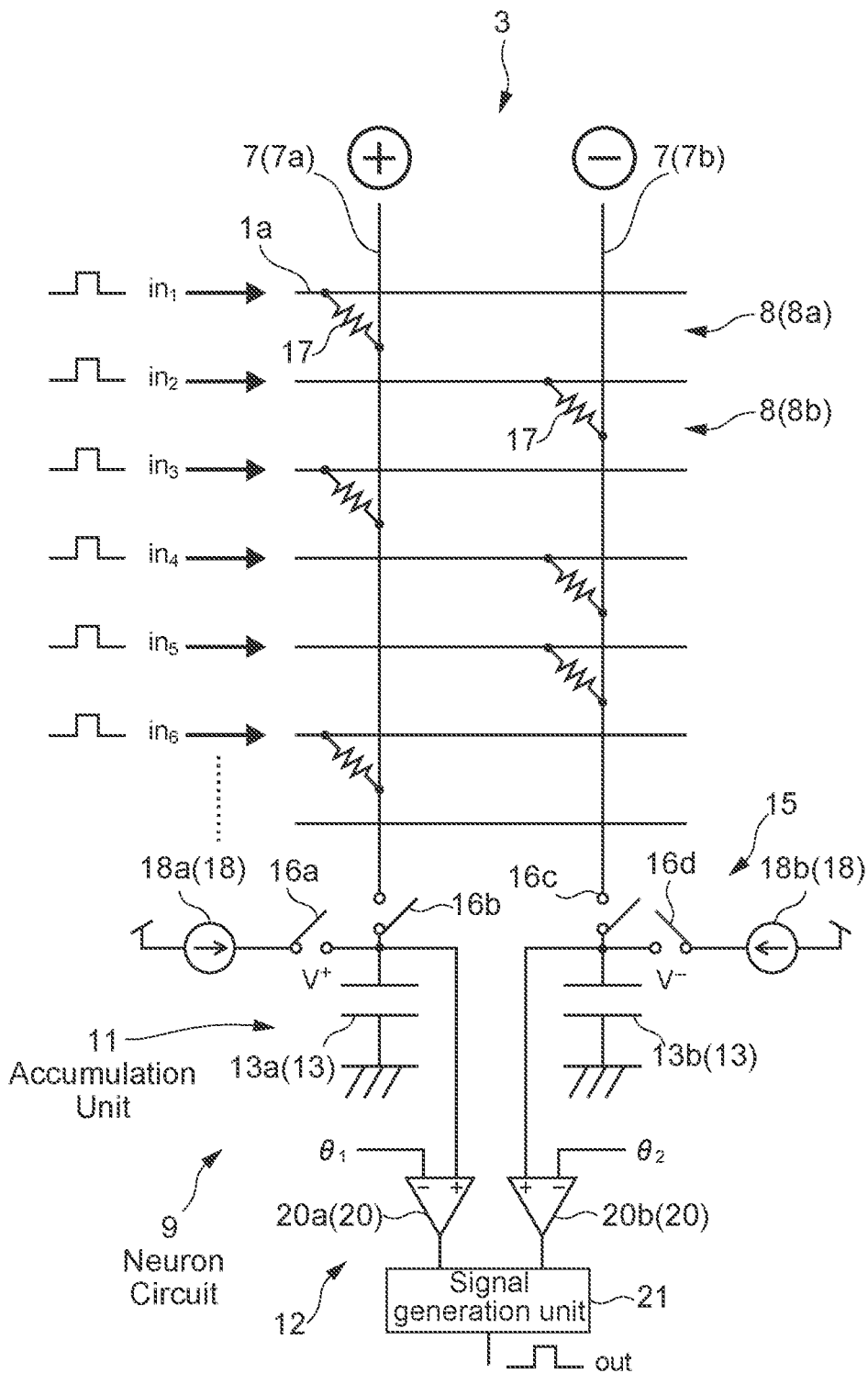
FIG. 5 is a schematic circuit diagram showing an example of the multiply-accumulate operation device.

FIG. 5 is a schematic circuit diagram showing an example of the multiply-accumulate operation device according to this embodiment. The multiply-accumulate operation devices 3 are provided to extend in a direction perpendicular to the plurality of input signal lines 1a. That is, in the example shown in FIG. 5, a crossbar configuration is employed.

The multiply-accumulate operation devices 3 each include a pair of output lines (the positive charge output line 7a and the negative charge output line 7b), a plurality of synapse circuits (the plurality of multiplication units) 8, and the neuron circuit 9. In the example shown in FIG. 5, the neuron circuit 9 includes the accumulation unit 11, a charging unit 15, the output unit 12, and switches 16a to 16d.

Pulse signals (PWM signals) having pulse widths corresponding to the signal value $x_i$ are input to the plurality of input signal lines 1a as input signals $in_1$ to $in_6$. In the example shown in FIG. 5, six input signal lines 1a are illustrated, but the number of the input signal lines 1a is not limited. The input signals $in_1$ to $in_6$ are input within the input period T having a predetermined length (see FIG. 6).

The positive charge output line 7a outputs positive weight charges corresponding to the multiplication value $w_i^+ \cdot x_i$ obtained by multiplying the signal value $x_i$ by the positive weight value $w_i^+$. The negative charge output line 7b outputs negative weight charges corresponding to the multiplication value obtained by multiplying the signal value $x_i$ by the negative weight value $w_i^-$. In this embodiment, the pair of output lines 7 correspond to the one or more output lines.

The plurality of synapse circuits 8 is provided corresponding to the plurality of input signal lines 1a. In this embodiment, one synapse circuit 8 is provided for one input signal line 1a. Each of the plurality of synapse circuits 8 includes a resistor 17 connected between a corresponding input signal line 1a of the plurality of input signal lines 1a and either one of the positive charge output line 7a and the negative charge output line 7b. This resistor 17 may have nonlinear characteristics and may have a function of preventing backflow of current. Then, charges corresponding to the multiplication value $w_i^+ \cdot x_i$ (or $|w_i^-| \cdot x_i$) is output to the output line 7a (or 7b) to which the resistor 17 is connected.

For example, in the case where it is desired to multiply the signal value $x_i$ by the positive weight value $w_i^+$ in each of the synapse circuits 8, the resistor 17 is connected between the input signal line 1a and the positive charge output line 7a, and the positive charge output line 7a is caused to output positive weight charges. In the example shown in FIG. 5, the synapse circuit 8 to which the input signals $in_k$, $in_3$, and $in_6$ are input is a synapse circuit 8a configured as a positive weight multiplication unit that generates positive weight charges. The synapse circuit 8a can be said to be a multiplication unit in which a positive weight is set.

In the case where it is desired to multiply the signal value $x_i$ by the negative weight value $w_i^-$ in each of the synapse circuits 8, the resistor 17 is connected between the input signal line 1a and the negative charge output line 7b, and the negative charge output line 7b is caused to output negative weight charges. In the example shown in FIG. 5, the synapse circuit 8 to which the input signals $in_2$, $in_4$, and $in_5$ are input is a synapse circuit 8b configured as a negative weight multiplication unit that generates negative weight charges. The synapse circuit 8b can be said to be a multiplication unit in which a negative weight is set.

Note that as the resistor 17, one having a resistance value corresponding to the weight value $w_i$ to be set is used. That is, the resistor 17 functions as an element that defines the weight value $w_i$ in the arithmetic logic unit 100 executing a multiply-accumulate operation in the multiply-accumulate operation devices 3.

As the resistor 17, for example, a fixed resistor element, a variable resistor element, a MOS transistor that operates in the subthreshold region, or the like is used. For example, by using a MOS transistor that operates in the subthreshold region as the resistor 17, it is possible to reduce the power consumption. It goes without saying that another arbitrary resistor may be used.

The accumulation unit 11 accumulates the sum of charges corresponding to the multiplication value $w_i \cdot x_i$ generated by each of the plurality of synapse circuits 8. In this embodiment, two capacitors 13a and 13b are provided as the accumulation unit 11.

The capacitor 13a is connected to the positive charge output line 7a via the switch 16b, and accumulates the sum of positive weight charges generated by the synapse circuit 8a. In this embodiment, the capacitor 13a functions as the positive weight accumulation unit.

The capacitor 13b is connected to the negative charge output line 7b via the switch 16c, and accumulates the sum of negative weight charges generated by the synapse circuits 8b. In this embodiment, the capacitor 13b functions as the negative weight accumulation unit.

The charging unit 15 charges, at the predetermined charging speed, the accumulation unit 11 in which the sum of charges corresponding to the multiplication value $w_i \cdot x_i$ is accumulated. In this embodiment, two current sources 18a and 18b are provided as the charging unit 15. Note that the charging is performed after the input period T is ended.

The current source 18a is connected to the side connected to the positive charge output line 7a of the capacitor 13a (the side opposite to the GND) via the switch 16a. The current source 18b is connected to the side connected to the negative charge output line 7b of the capacitor 13b (the side opposite to the GND) via the switch 16d.

In this embodiment, the current sources 18a and 18b charge the capacitors 13a and 13b at the same charging speed. This increases a potential $V^+$ of the positive charge output line 7a (the voltage held by the capacitor 13a) and a potential $V^-$ of the negative charge output line 7b (the voltage held by the capacitor 13b). The specific configuration of the current source 18 is not limited, and may be arbitrarily designed.

The output unit 12 outputs a multiply-accumulate signal representing the sum of the multiplication value $w_i \cdot x_i$ by executing threshold determination by a predetermined threshold value on the voltage held by the accumulation unit 11, after starting charging by the charging unit 15. In this embodiment, two comparators 20a and 20b and a signal generation unit 21 are provided as the output unit 12.

The comparator 20a detects the timing when the voltage held by the capacitor 13a becomes larger than a predetermined threshold value $\theta 1$. Note that the magnitude of the voltage held by the capacitor 13a is determined by the total amount and charge amount (charging speed×time) of positive weight charges accumulated in the capacitor 13a.

The comparator 20b detects the timing when the voltage held by the capacitor 13b becomes larger than a predetermined threshold value $\theta 2$. Note that the magnitude of the voltage held by the capacitor 13b is determined by the total amount and charge amount (charging speed×time) of negative weight charges accumulated in the capacitor 13b.

Note that in this embodiment, a multiply-accumulate signal is output by executing threshold determination on each of the capacitors 13a and 13b by the same threshold value. That is, the threshold value θ1 is set to be equal to the threshold value θ2.

The signal generation unit 21 outputs a multiply-accumulate signal representing the sum of the multiplication value $w_i \cdot x_i$ on the basis of the timing detected by the comparator 20a and the timing detected by the comparator 20b. That is, the signal generation unit 21 outputs a multiply-accumulate signal on the basis of the timing when the voltage held by the capacitor 13a reaches the threshold value θ1 and the timing when the voltage held by the capacitor 13b reaches the threshold value θ2 (=θ1).

In this embodiment, a PMW signal, which is a pulse signal in which the pulse width is modulated, is output as a multiply-accumulate signal. The specific circuit configuration and the like of the signal generation unit 21 are not limited, and may be arbitrarily designed.

Figure 6:
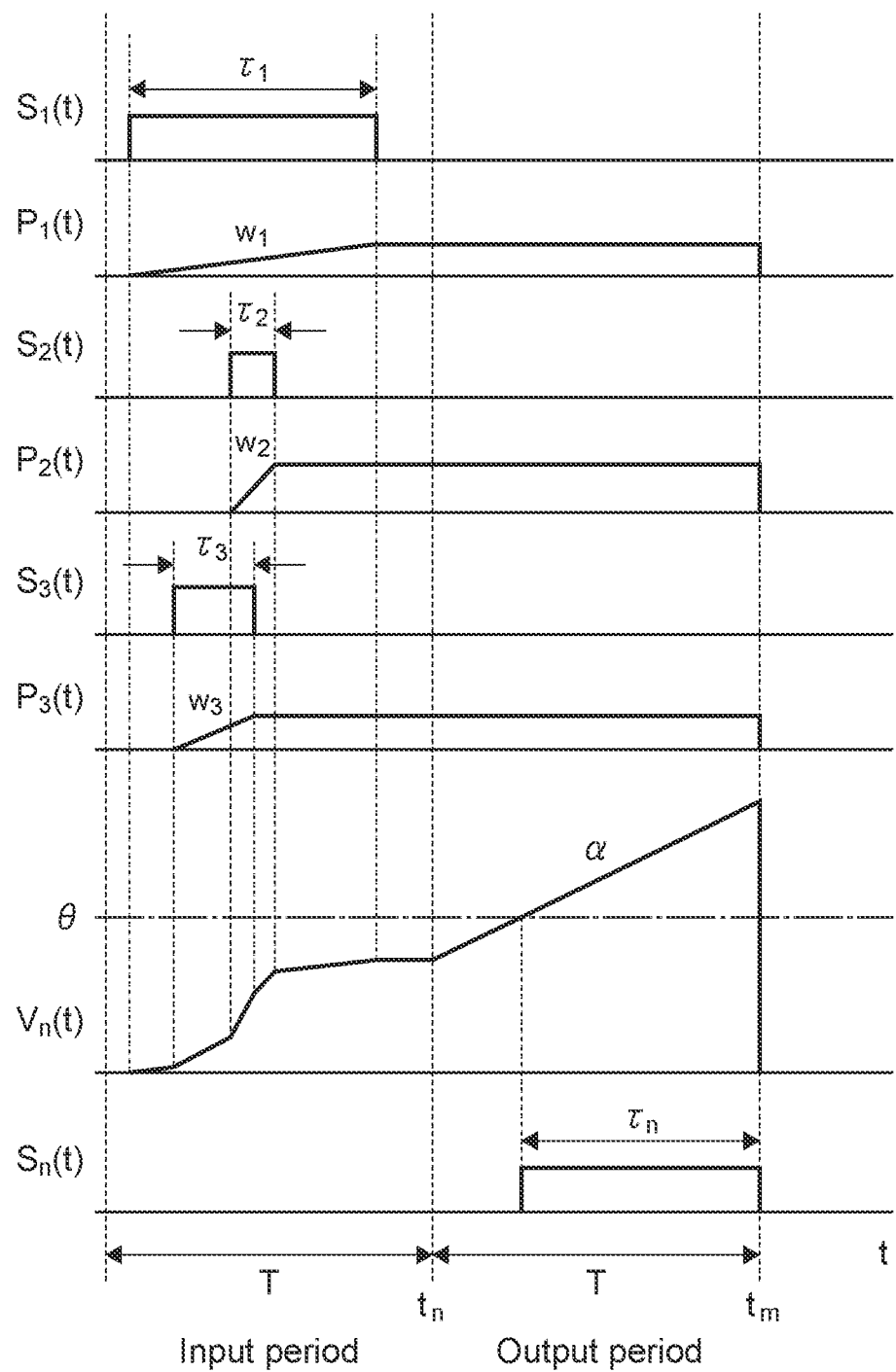
FIG. 6 is a diagram for describing a calculation example of a multiply-accumulate signal by the multiply-accumulate operation device shown in FIG. 5.
Figure 7:
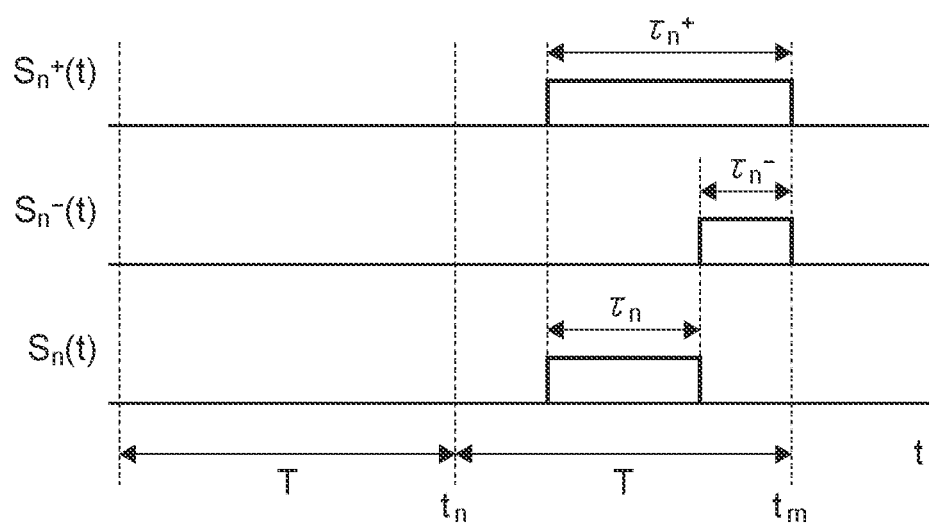
FIG. 7 is a schematic diagram showing a calculation example of a multiply-accumulate signal indicating the entire multiply-accumulate result.

FIG. 6 and FIG. 7 are each a diagram describing a calculation example of the multiply-accumulate signal by the multiply-accumulate operation devices 3 shown in FIG. 5. In this embodiment, a signal representing the entire multiply-accumulate result including the positive and negative ones is calculated on the basis of the multiply-accumulate result of positive weight charges based on positive weight charges accumulated in the capacitor 13a, and the multiply-accumulate result of negative weight charges based on negative weight charges accumulated in the capacitor 13b.

Calculation of the multiply-accumulate result of positive weight charges and calculation of the multiply-accumulate result of negative weight charges are mutually equal processing. First, a method of calculating the multiply-accumulate result based on charges accumulated in the capacitor 13 without discrimination between positive and negative (a multiply-accumulate operation method) will be described with reference to FIG. 6.

The parameters described in FIG. 6 will be described. "t" represents time. "T" represents each of the input period and the output period. "$t_n$" represents the end timing of the input period T, and "$t_m$" represents the end timing of the output period T.

In this embodiment, the length of the input period T and the length of the output period T are set to be equal to each other. Further, the output period T is started from an end timing $t_n$ of the input period T. Therefore, the end timing $t_n$ of the input period T corresponds to the start timing of the output period T.

"α" represents the slope of the potential rise corresponding to the charging by the charging unit 15 (the current source 18) and corresponds to the charging speed. "θ" represents a threshold value used for threshold determination by the output unit 12 (comparator 20).

"$S_i(t)$" is the input signal (PWM signal) to be input to the i-th input signal line 1a. "$\tau_i$" represents the pulse width of the input signal $S_i(t)$. "$P_i(t)$" represents the amount of change in the internal state (potential) of the respective synapse circuits 8 shown in FIG. 5. "$w_i$" represents a weight value and is defined by a resistance value of the resistor 17 shown in FIG. 5.

"$V_n(t)$" represents the total sum of "$P_i(t)$" and corresponds to the total amount of charges accumulated in the capacitor 13. "$S_n(t)$" represents a multiply-accumulate signal (PWM signal) representing the multiply-accumulate result. "$t_n$" represents the pulse width of the multiply-accumulate signal to be output. Specifically, "$\tau_n$" represents a value corresponding to the length from the timing when the voltage held by the capacitor 13 has become larger than the threshold value θ in the output period T to an end timing $t_m$ of the output period T.

In this Example, the switches 16b and 16c are provided, and particularly, it is possible to reduce the power consumption and improve the charging accuracy by disconnecting the output line with this switch.

Here, as shown in the following formula, the input value (signal value) $x_i$ is given by the duty ratio $R_i$ ($=\tau_i/T$) of the pulse width Ti of the input signal $S_i(t)$ to the input period T.

$$x_i = R_i\left(=\frac{\tau_i}{T}\right) \quad [\text{Math. 3}]$$

The synapse circuit 8 shown in FIG. 5 produces charges corresponding to the multiplication value obtained by multiplying the signal value $x_i$ by the weight value $w_i$. Specifically, the resistance of the resistor 17 increases the internal state (potential) at a constant slope $w_i$.

Then, a change amount $P_i(t_n)$ of the internal potential of each of the synapse circuits 8 in the end timing $t_n$ of the input period T is given by the following formula. Note that the high-level value of the input-signal $S_i(t)$ is set to 1.

$$P_i(t_n) = w_i R_i T = w_i x_i T \quad [\text{Math. 4}]$$

The total amount $V_n(t_n)$ of charges accumulated in the capacitor 13 is the total sum of $P_i(t_n)$, and thus is given by the following formula.

$$V_n(t_n) = \sum_{i=1}^{N} P_i(t_n) = \tau \sum_{i=1}^{N} w_i x_i \quad [\text{Math. 5}]$$

The switches 16a and 16d shown in FIG. 5 are switched to ON at the end timing $t_n$ of the input period T, and the switches 16b and 16c are switched to OFF. Then, the charging by the charging unit 15 (the current source 18) is started at the end timing $t_n$ of the input period T. Therefore, in this embodiment, the output period T is started at the start timing of the charging by the charging unit 15. That is, the charging and the output period are started simultaneously at the end timing $t_n$ of the input period T.

The current source 18 increases the internal potential of each of the synapse circuits 8 from the end timing $t_n$ of the input period T at the slope (charging speed) a. Then, a multiply-accumulate signal (PWM signal) having the pulse width $\tau_n$ corresponding to the length from the timing when the voltage held by the capacitor 13 has become larger than the threshold value θ in the output period T to the end timing t m of the output period T is generated.

When the duty ratio of the pulse width $\tau_n$ of the multiply-accumulate signal to the output period T is defined as $R_n(=\tau_n/T)$, $R_n$ is given by the following formula. Note that the threshold value θ is assumed to be equal to or greater than the total amount $V_n(t_n)$ of charges.

$$R_n = \frac{T - \frac{(\theta - V_n(t_n))}{\alpha}}{T} = \frac{1}{\alpha}\sum_{i=1}^{N} w_i x_i + \frac{(\alpha T - \theta)}{\alpha T} \quad [\text{Math. 6}]$$

Therefore, the multiply-accumulate result of the sum of the multiplication values $w_i \cdot x_i$ obtained by multiplying the signal value $x_i$ by the weight value $w_i$ is given by the following formula.

$$\sum_{i=1}^{N} w_i x_i = \alpha R_n - \frac{(\alpha T - \theta)}{T} \quad \text{[Math. 7]}$$

That is, the multiply-accumulate result is a value obtained by subtracting the constant defined by the charging speed α, the threshold value θ, and the output period T from $\alpha R_n = \alpha \cdot (\tau_n/T)$. In this way, a multiply-accumulate signal representing the multiply-accumulate result can be output on the basis of the timing when the voltage held by the accumulation unit 11 has become larger than the threshold value θ in the output period T having a predetermined length.

FIG. 7 is a schematic diagram showing a calculation example of a multiply-accumulate signal showing the entire multiply-accumulate result based on multiply-accumulate results of both positive weight charges and negative weight charges. In FIG. 7, the multiply-accumulate signal representing the multiply-accumulate result of positive weight charges is defined as "$S_n^+(t)$", and the pulse width thereof is defined as "$\tau_n^+$". Further, the multiply-accumulate signal representing the multiply-accumulate result of negative weight charges is defined as "$S_n^-(t)$", and the pulse width thereof is defined as "$\tau_n^-$". Further, the multiply-accumulate signal representing the entire multiply-accumulate result is defined as "$S_n(t)$", and the pulse width thereof is defined as "$T_n$".

The total amount $V_n^+(t_n)$ of positive weight charges accumulated in the capacitor 13a at the end timing $t_n$ of the input period T is given by the following formula. Note that $w_i+$ represents a positive weight value.

$$V_n^+(t_n) = T \sum_{i=1}^{N^+} w_i^+ x_i \quad \text{[Math. 8]}$$

The total amount $V_n^-(t_n)$ of negative weight charges accumulated in the capacitor 13b at the end timing $t_n$ of the input period T is given by the following formula. Note that is a negative weight value.

$$V_n^-(t_n) = T \sum_{i=1}^{N^-} |w_i^-| x_i \quad \text{[Math. 9]}$$

When the duty ratio of the positive multiply-accumulate signal $S_n^+(t)$ is defined as $R_n^+(=\tau_n^+/T)$, the positive multiply-accumulate result of the sum of the multiplication values $w_i^+ \cdot x_i$ obtained by multiplying the signal value $x_i$ by the positive weight value $w_i^+$ is given by the following formula. Note that the threshold value θ is assumed to be equal to or greater than the total amount $V_n^+(t_n)$ of positive weight charges.

$$\sum_{i=1}^{N^+} w_i^+ x_i = \alpha R_n^+ - \frac{(\alpha T - \theta)}{T} \quad \text{[Math. 10]}$$

When the duty ratio of the negative multiply-accumulate signal $S_n^-(t)$ is defined as $R_n^-(=\tau_n^-/T)$, the negative multiply-accumulate result of the sum of the multiplication values $|w_i^-| \cdot x_i$ obtained by multiplying the input value $x_i$ by the negative weight value $w_i^-$ is given by the following formula. Note that the charging speed α and the threshold value θ are equal to the values used in the formula (Math. 10). Further, the threshold value θ is assumed to be equal to or greater than the total amount $V_n^-(t_n)$ of negative weight charges.

$$\sum_{i=1}^{N^-} |w_i^-| x_i = \alpha R_n^- - \frac{(\alpha T - \theta)}{T} \quad \text{[Math. 11]}$$

Therefore, when the above-mentioned formula (Math. 2) is used, the entire multiply-accumulate result is given by the following formula.

$$\sum_{i=1}^{N} w_i x_i = \alpha(R_n^+ - R_n^-)\left( = a\frac{\tau_n^+ - \tau_n^-}{T} \right) \quad \text{[Math. 12]}$$

That is, the entire multiply-accumulate result is obtained by the charging speed α, the pulse width $\tau_n^+$ of the multiply-accumulate signal $S_n^+(t)$, the pulse width $T_n^-$ of the multiply-accumulate signal $S_n^-(t)$, and the output period T. That is, it is possible to easily calculate the multiply-accumulate result on the basis of the timing detected by the comparator 20a and the timing detected by the comparator 20b.

Then, as shown in FIG. 7, as the multiply-accumulate signal representing the entire multiply-accumulate result, the multiply-accumulate signal "$S_n(t)$" having the pulse width "$\tau_n$" can be easily output.

Here, the present inventors have examined the charging speed α and the threshold value θ for generating the multiply-accumulate signal $S_n(t)$ representing the multiply-accumulated result. Then, the present inventors have devised a new technology for setting the charging speed α and the threshold value θ. It will be described in detail below.

Figure 8:
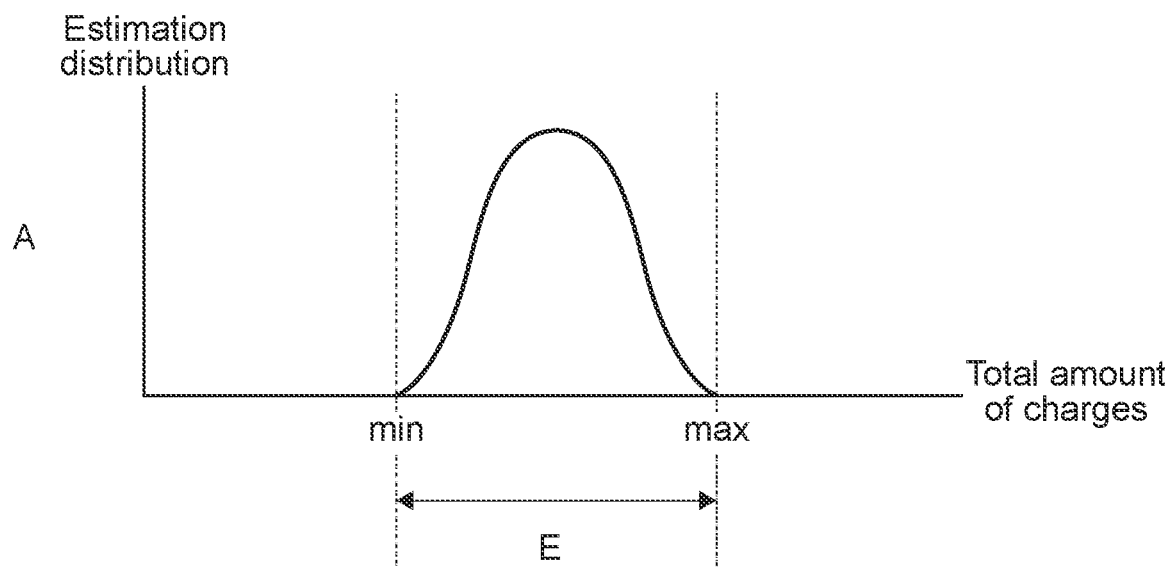
FIG. 8 is a schematic diagram for describing setting of a charging speed and a threshold value.
Figure 8:
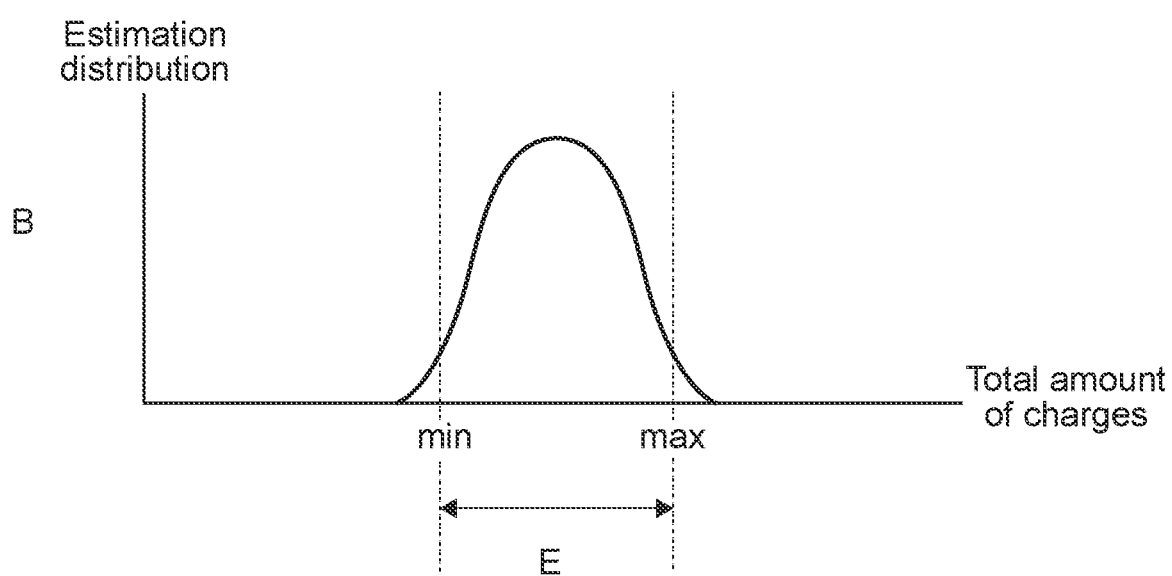
Figure 9:
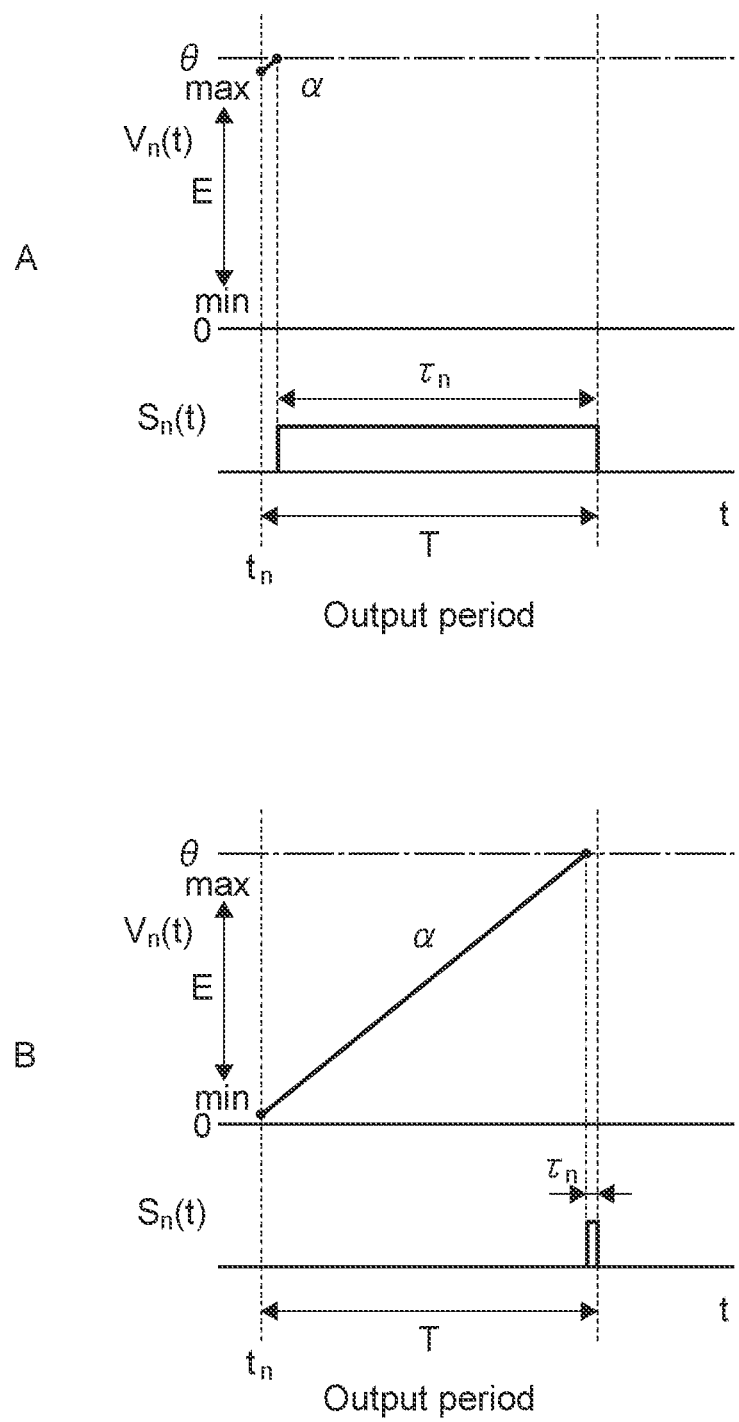
FIG. 9 is a schematic diagram for describing the setting of the charging speed and the threshold value.
Figure 10:
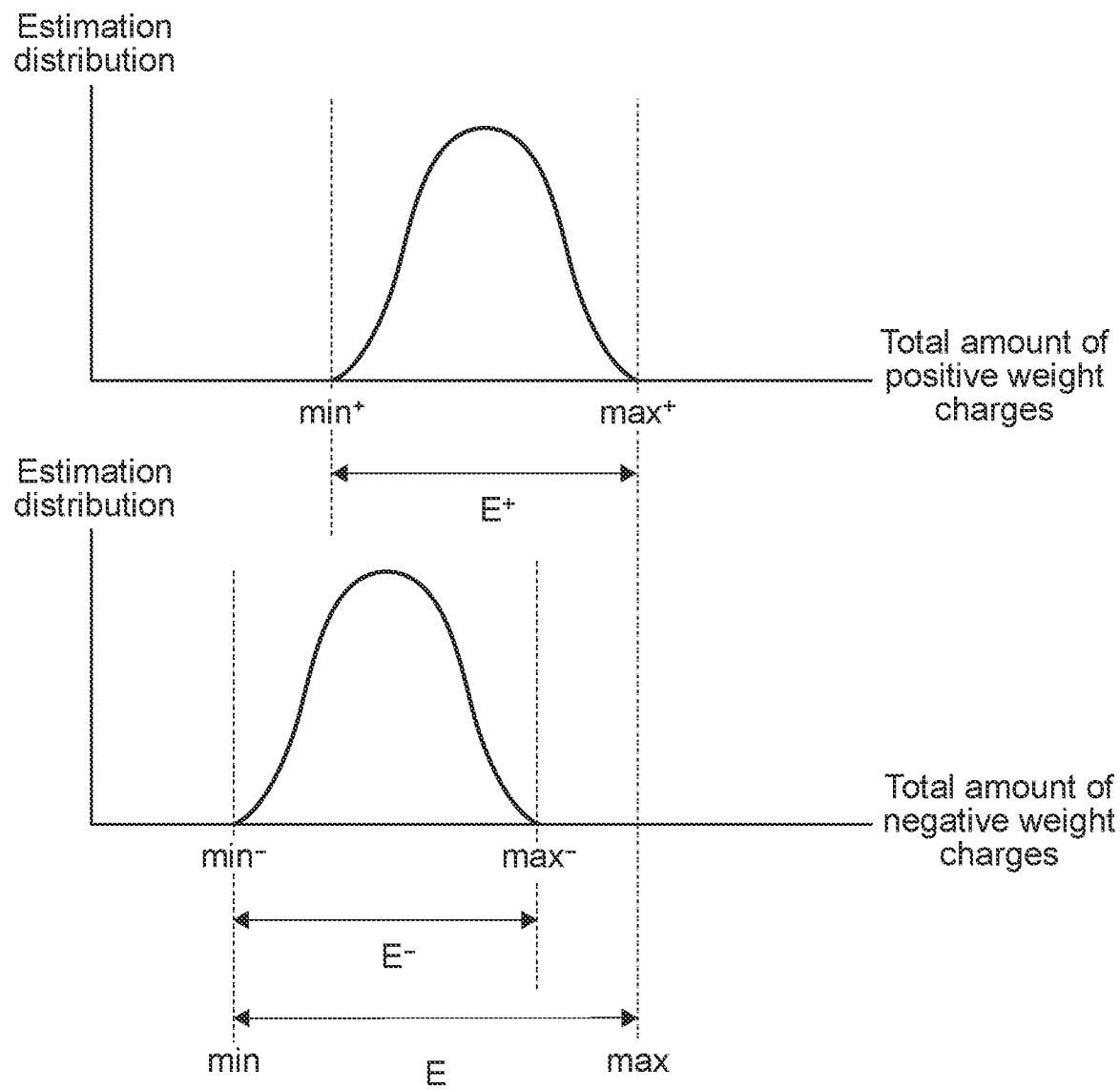
FIG. 10 is a schematic diagram for describing the setting of the charging speed and the threshold value.

FIGS. 8 to 10 are each a schematic diagram for describing the setting of the charging speed α and the threshold value θ. As described above, any of positive weight charges and negative weight charges is converted into timing when the total amount of charges has become larger than the threshold value θ in the output period T by charging the capacitor 13 in which the sum of charges corresponding to the multiplication value $w_i \cdot x_i$ is accumulated. Therefore, it is desirable to detect the total amount of charges accumulated in the capacitor 13 at a higher resolution and at the timing in the output period T.

Here, the present inventors have newly devised setting of the charging speed α and the threshold value θ focusing on the accumulation state of the capacitor 13. That is, the present inventors have newly devised using of the charging speed α and the threshold value θ associated with the accumulation state of the capacitor 13 as the charging speed α and the threshold value θ for generating the multiply-accumulate signal $S_n(t)$ representing the multiply-accumulated result.

Note that in the present disclosure, the accumulation state of the capacitor 13 includes information on how much charges are accumulated in the capacitor 13, and includes, for example, an estimation result of charges accumulated in the capacitor 13 and a simulation result. For example, by using the charging speed α and the threshold value θ associated with the estimation result and the simulation result, it is possible to improve the accuracy of the multiply-accumulate operation.

For example, when a neural network is constructed using the arithmetic logic unit 100 using the multiply-accumulate operation devices 3, learning processing using learning data is executed. Then, the weight to be set in the respective synapse circuits 8 is set. The method of the learning processing is not limited, and an arbitrary method such as a method using computer simulation may be used.

For example, after the respective weights are set by the learning processing (e.g., after a predetermined resistor is disposed at a predetermined position), the total amount of weights accumulated in the capacitor 13 is estimated as the accumulation state of the capacitor 13.

On the basis of the estimation results, an effective range to be calculated as a multiply-accumulate signal is determined with respect to the total amount of accumulated weights. The method of estimating the total amount of weights is not limited. For example, an arbitrary method such as a method of using computer simulation, a method of using probability distribution, and an estimation method based on the result of inputting a plurality of pieces of sample data to the multiply-accumulate operation devices 3 may be used. Note that the estimation result obtained by estimating the total amount of charges can also be referred to as the simulation result obtained by simulating the total amount of charges.

For example, assumption is made that distribution as shown in Part A of FIG. 8 is obtained as the estimation result of the total amount of charges accumulated in the predetermined capacitor 13. In this case, for example, the range from a minimum value min to a maximum value max of the distribution is set as an effective range E to be calculated as a multiply-accumulate signal.

Hereinafter, the minimum value min and the maximum value max of the effective range E will be referred to as the effective minimum value min, and the effective maximum value max. The effective minimum value min and the effective maximum value max are the parameters obtained from the estimation result of charges corresponding to the multiplication value $w_i \cdot x_i$ accumulated by the accumulation unit 11.

For example, the charging speed $\alpha$ and the threshold value $\theta$ are set on the basis of the effective range E from the effective maximum value max to the effective minimum value min. Specifically, the charging speed $\alpha$ and the threshold value $\theta$ are set so that the effective range E is within a range in which a multiply-accumulate signal can be output in the output period T. That is, the charging speed $\alpha$ and the threshold value $\theta$ is set so that the total amount of charges included in the effective range E has become larger than the threshold value $\theta$ in the output period T by charging.

For example, as shown in Parts A and B of FIG. 9, in the case where the total amount of accumulated charges is the effective maximum value max, the calculation timing for calculating a multiply-accumulate signal (timing when the holding voltage has become larger than the threshold value $\theta$) is timing immediately after a start timing $t_n$ of the output period T. Further, in the case where the total amount of accumulated charges is the effective minimum value min, the calculation timing for calculating a multiply-accumulate signal is timing immediately before the end timing of the output period T. The charging speed $\alpha$ and the threshold value $\theta$ are set so as to satisfy such conditions.

For example, a value slightly larger than the effective maximum value max is set as the threshold value $\theta$. Then, the charging speed $\alpha$ is set so that the calculation timing corresponding to the effective maximum value max is timing the smallest unit of the pulse width after the start timing $t_n$ of the output period T, and so that the calculation timing corresponding to the effective minimum value min is timing the smallest unit of the pulse width before the end timing of the output period T.

In this case, as shown in Parts A and B of FIG. 9, a PWM signal whose pulse width is smaller than that of the output period T by the smallest unit of the pulse width is calculated as the multiply-accumulate signal corresponding to the effective maximum value max. Further, the PWM signal having a pulse width corresponding to the smallest unit of the pulse width is calculated as the multiply-accumulate signal corresponding to the effective minimum value min. Note that the calculation timing can also be referred to as the output pulse timing.

For example, the charging speed $\alpha$ and the threshold value $\theta$ are set on the basis of the effective minimum value min, the effective maximum value max, and the output period T as described above. As a result, the total amount of charges included in the effective range E can be detected at a very high resolution and at the timing by using substantially the entire area of the output period T. That is, in this embodiment, the effective range E to be calculated can be extended to the entire area of the output period T by appropriately setting the charging speed $\alpha$ and the threshold value $\theta$. This is equivalent to causing the distribution of the distribution of the output results of the multiply-accumulate operation to effectively correspond to the output period T. As a result, it is possible to calculate the multiply-accumulate result with very high accuracy.

Note that how the distribution of the output result of the operation result is caused to correspond to the output period T is not limited and may be arbitrarily set.

Further, the method of setting the effective range E based on the estimation result is also not limited. For example, as shown in Part B of FIG. 8, a value larger than the smallest value of the distribution of the estimated total amount of charges may be set as the effective minimum value min. Further, a value smaller than the largest value of the distribution of the estimated total amount of charges may be set as the effective maximum value max.

In this case, for example, in the case where the total amount of charges is smaller than the effective minimum value min, 0 is output as the multiply-accumulate result. Further, in the case where the total amount of charges has become larger than the effective maximum value max, a multiply-accumulate result corresponding to the effective maximum value max is output as a multiply-accumulate result. It goes without saying that the present technology is not limited thereto.

The effective range E may be arbitrarily set so as to realize desired processing accuracy in, for example, recognition processing using a neural network. For example, probability distribution such as normal distribution (Gaussian distribution) may be calculated as an estimation result, and the effective range E may be set with reference to the range of $1\sigma$, $2\sigma$, $3\sigma$, and the like.

In the multiply-accumulate operation device 3 illustrated in FIG. 5, the current sources 18a and 18b charge the capacitors 13a and 13b at the same charging speed. Further, threshold determination is executed using the same threshold value on each of the capacitors 13a and 13b. That is, using the same charging speed $\alpha$ and the same threshold value $\theta$, the multiply-accumulate results of positive weight charges and the multiply-accumulate result of negative weight charges are calculated.

For example, as shown in FIG. 10, an effective range $E^+$ for positive weight charges (an effective minimum value $min^+$ to an effective maximum value $max^+$) is set on the basis of the estimation result of the total amount of positive weight charges accumulated in the capacitor 13a. Further, an effective range E⁻ for negative weight charges (an effective minimum value min⁻ to an effective maximum value max⁻) is set on the basis of the estimation result of the total amount of negative weight charges accumulated in the capacitor 13b.

The effective range E is set so that the total amount of charges included in the effective range E⁺ and the effective range E⁻ is detected at a higher resolution. As a specific example, the effective minimum value min⁺ of the effective range E⁺ and the effective minimum value min⁻ of the effective range E⁻ are compared to each other, and the smaller value is used as the effective minimum value min. Further, the effective maximum value max⁺ of the effective range E⁺ and the effective maximum value max⁻ of the effective range E⁻ are compared to each other, and the larger value is used as the effective maximum value max.

The charging speed α and the threshold value θ are set on the basis of the effective range E specified in the effective minimum value min and the effective maximum value max. As a result, it is possible to calculate the entire multiply-accumulate result with very high accuracy. It goes without saying that the present technology is not limited this method.

Further, in the configuration as illustrated in FIG. 1, typically, the same charging speed α and the threshold value θ are commonly used for the plurality of multiply-accumulate operation devices 3 included in the same layer. As a result, the output represented by the multiply-accumulate signal (PWM signal) output from each of the multiply-accumulate operation devices 3 is output to the next layer as the value according to the same standard. Further, the designing for the respective multiply-accumulate operation devices 3 can also be simplified.

As the setting of the common charging speed α and the a threshold value θ, for example, the effective range E is set for the total amount of charges accumulated in the accumulation unit 11 in each of the multiply-accumulate operation devices. Then, a common effective range is set so as to encompass all the effective range E. The common charging speed α and the common threshold value θ can be set on the basis of the entire effective range. It goes without saying that the present technology is not limited to this method, and an arbitrary method may be used.

Note that the present technology is not limited to the case where the common charging speed α and the common threshold value θ are used, and the optimal charging speed α and the optimal threshold value θ may be set in each of the multiply-accumulate operation devices 3. That is, the effective range E may be set in each of the multiply-accumulate operation devices 3, and the charging speed α and the threshold value θ may be optimized. Even in this case, it is possible to realize, for example, desired processing accuracy by appropriately executing, for example, learning processing.

In the setting of the charging speed α and the threshold value θ with respect to the multiply-accumulate operation device 3, the charging speed α and the threshold value θ optimized in advance are set as fixed values when configuring the multiply-accumulate operation devices 3, for example. Alternatively, the multiply-accumulate operation device 3 may be configured such that the charging speed α and the threshold value θ can be dynamically changed. Then, the optimization of the charging speed α and the threshold value θ may be dynamically executed while executing recognition processing or the like. The specific circuit configuration capable of dynamically changing the charging speed α and the threshold value θ is not limited, and may be arbitrarily designed.

As described above, in the arithmetic logic unit 100 and the multiply-accumulate operation devices 3 according to this embodiment, the charging speed for charging the accumulation unit 11 and the threshold value θ used to output the multiply-accumulate signal representing the sum of the multiplication values wixi are set in association with the accumulation state of the accumulation unit 11. As a result, it is possible to improve the resolution for expressing the result of the multiply-accumulate operation, and improve the accuracy of the operation.

When the maximum value and the minimum value of the output result of the multiply-accumulate operation are converted into the pulse timing within the pulse output period T, the distribution of the multiply-accumulate operation result is examined in advance. Then, the value of the threshold value θ and the current value of the current source ((independent) charge outputting unit) are set in accordance with the maximum/minimum value. This makes it possible to utilize the resolution of the pulse output period to the maximum. That is, the voltage corresponding to the multiply-accumulate operation result can be efficiently converted into the pulse timing.

For example, a method of accumulating an electronic signal (spike timing signal) whose pulse rises at timing corresponding to the signal value $x_i$ in a capacitor and calculating the multiply-accumulate signal on the basis of the timing when the accumulated electronic signal has become larger than a threshold voltage is conceivable. In this method, the multiply-accumulate operation process of the input and the process of converting charges into the timing, which represents it as the output timing, are interlocked with each other, resulting in constraints on the control.

In this embodiment, the input period T and the output period T are set separately in the PWM multiply-accumulate operation device 3. Then, the capacitor is charged after the input period T is ended, and threshold determination is performed to calculate the multiply-accumulate signal. Therefore, since the multiply-accumulate operation process of the input and the process of converting charges into the timing can be separated from each other, the above-mentioned problems can be prevented.

Further, both positive and negative multiply-accumulate operations and timing output are performed, and then, the difference between the timing is obtained. As a result, it is possible to perform the positive and negative multiply-accumulate operations in the same circuit configuration, and sufficiently suppress the influence of the circuit variation. Note that when the positive and negative multiply-accumulate result are substantially equal to each other, the difference is very small, and there is a possibility that the resolution representing the entire positive and negative multiply-accumulate results is lowered. However, in this embodiment, the resolution of the pulse output period can be utilized to the maximum by optimizing the charging speed α and the threshold value θ, and thus such problems can be sufficiently prevented.

Second Embodiment

A multiply-accumulate operation device according to a second embodiment of the present technology will be described. In the following description, the description of the configurations and effects similar to those of the multiply-accumulate operation devices 3 described in the above-mentioned embodiment will be omitted or simplified.

FIG. 11, FIG. 12

Figure 11:
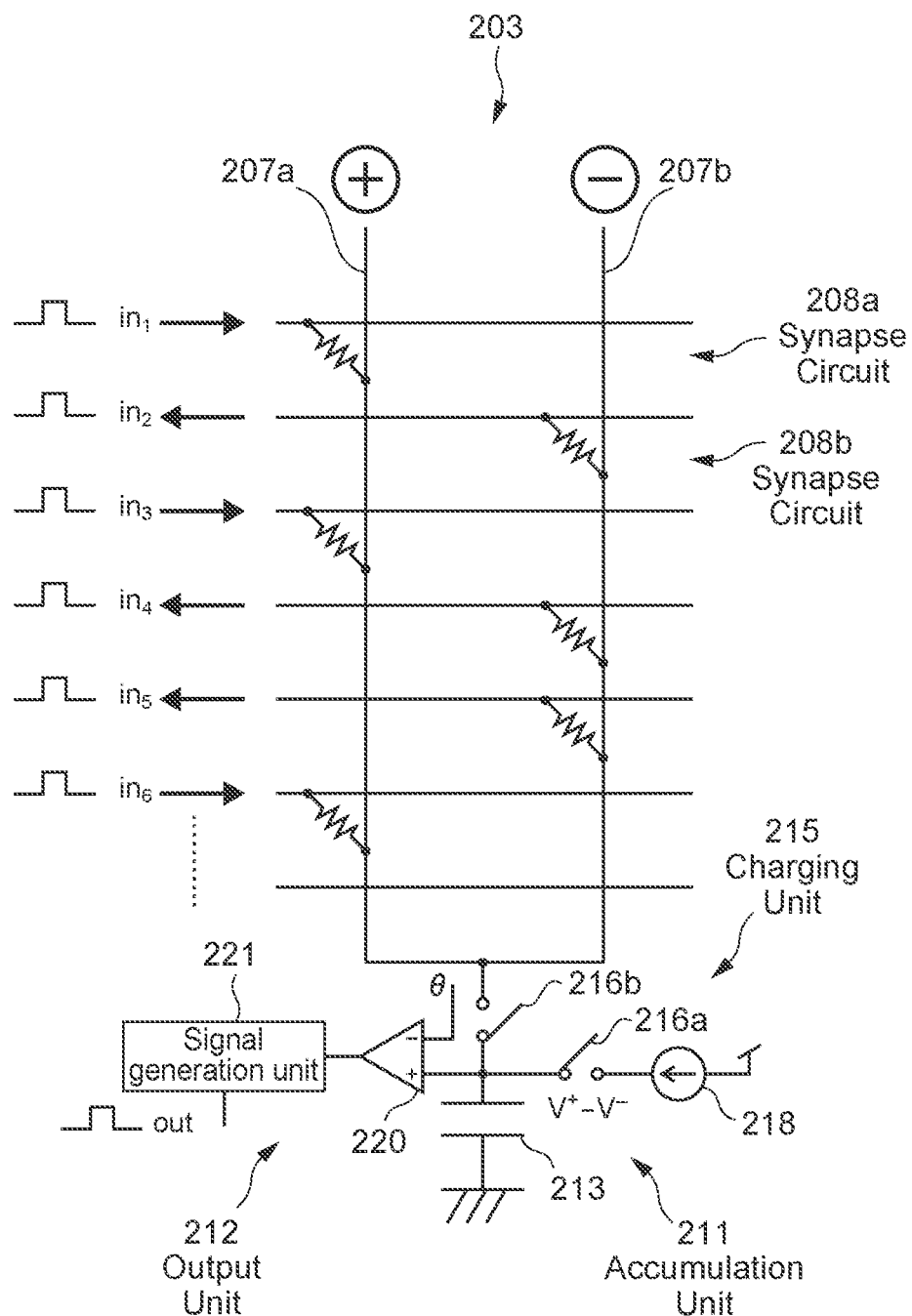
FIG. 11 is a schematic circuit diagram showing an example of a multiply-accumulate operation device according to a second embodiment.
Figure 12:
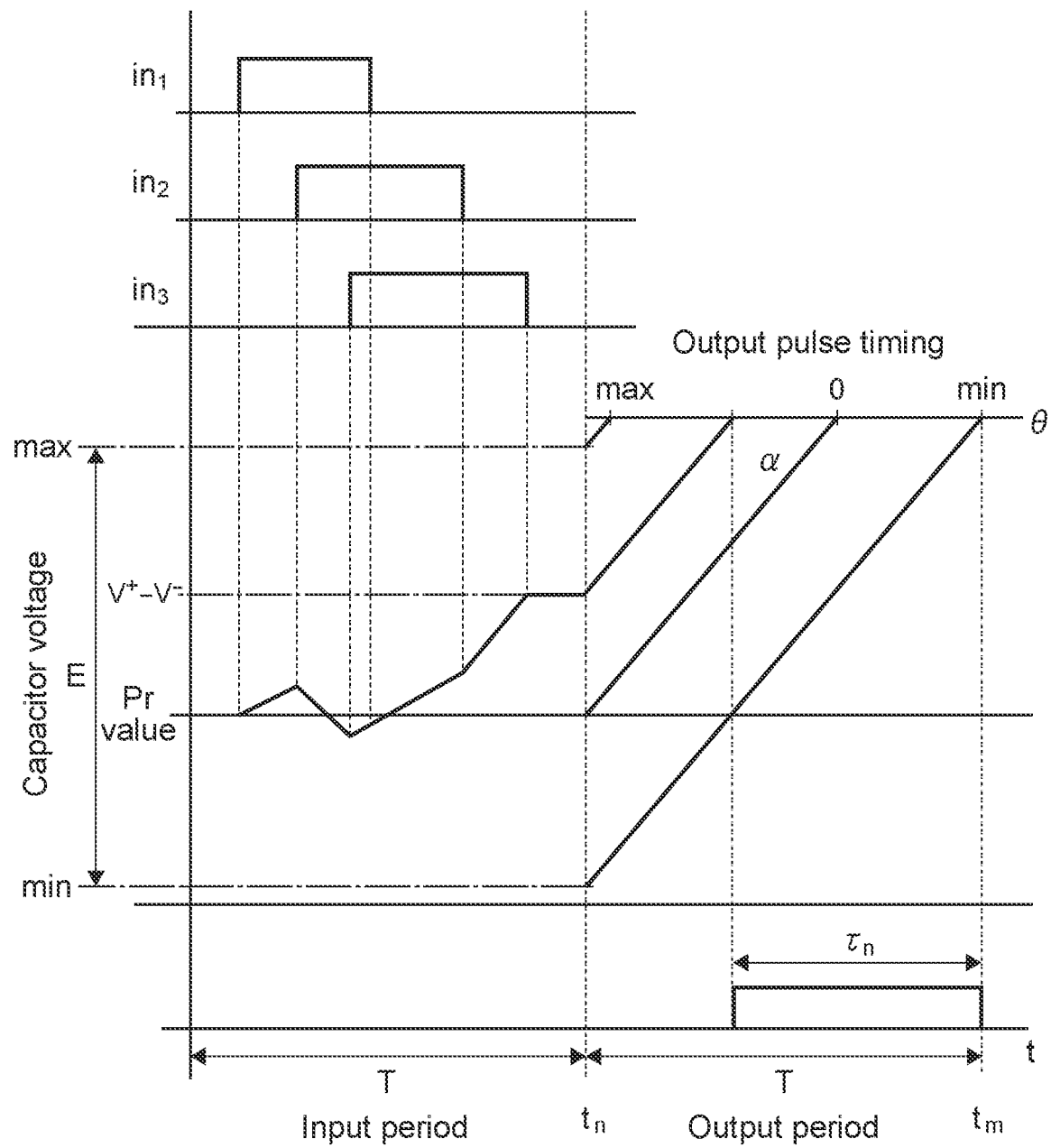
FIG. 12 is a diagram for describing a calculation example of a multiply-accumulate signal by the multiply-accumulate operation device shown in FIG. 11.

FIG. 11 is a schematic diagram showing an example of a multiply-accumulate operation device according to this embodiment. FIG. 12 is a diagram for describing a calculation example of a multiply-accumulate signal by a multiply-accumulate operation device 203 shown in FIG. 11.

In the multiply-accumulate operation device 203 according to this embodiment, positive and negative results are collectively input to one capacitor 213, and charges ($V^+$-$V^-$) corresponding to the difference between the total amount of positive weight charges and the total amount of negative weight charges are held.

In the example shown in FIG. 11, positive weight charges are generated by a synapse circuit 208a configured as a positive weight multiplication unit, and accumulated in the capacitor 213 included in an accumulation unit 211 via a positive charge output line 207a. Meanwhile, negative weight charges generated by a synapse circuit 208b configured as a negative weight multiplication unit are discharged from the capacitor 213 via a negative charge output line 207b.

As a result, charges ($V^+$-$V^-$) corresponding to the difference between the total amount of positive weight charges and the total amount of negative weight charges are accumulated in the capacitor 213. That is, in this embodiment, positive weight charges are accumulated and negative weight charges are discharged by the accumulation unit 211.

Although not shown in FIG. 11, a discharge circuit or the like is configured to discharge negative weight charges generated by the synapse circuit 208b from the capacitor 213 through the negative charge output line 207b. The input signals (PMW signals) $in_2$, $in_4$, and $in_5$ are input to the discharge circuit or the like, and thus, negative weight charges are discharged.

The discharge circuit or the like for discharging negative weight charges is an element included in the accumulation unit 211. Further, the input signal line for inputting the input signals (PMW signals) $in_2$, $in_4$, and $in_5$ to the discharge circuit or the like is a signal line included in the plurality of input lines. The specific configuration of the discharge circuit or the like is not limited and may be arbitrarily designed.

At the start timing of the input period T shown in FIG. 12, a switch 216a is turned OFF and a switch 216b is turned ON. Then, an input signal is input within the input period T. Note that in FIG. 12, only the input signals ink, inn, and $in_3$ are illustrated to simplify the description. Hereinafter, description will be made using a case where the input signals $in_1$, $in_2$, and in 3 are input as an example.

Positive weight charges corresponding to the input signals $in_1$ and $in_3$ are accumulated in the capacitor 213, and negative weight charges corresponding to the input signal $in_2$ is discharged. Note that in this embodiment, the capacitor 213 is charged in advance until the capacitor voltage reaches a predetermined preset value (default value). As a result, it is possible to cope with accumulation and discharging of charges and hold the charges ($V^+$-$V^-$). The preset value may be arbitrarily set.

At the end timing $t_n$ of the input period T, the switch 216a is switched to ON and the switch 216b is switched to OFF. Then, at the end timing $t_n$ of the input period T, charging by a charging unit 215 (current source 218) is started.

Further, the timing when the voltage held by the capacitor 213 has become larger than the threshold value θ is detected by a comparator 220 of an output unit 212. A multiply-accumulate signal (PWM signal) is calculated by a signal generation unit 221 on the basis of the detected timing.

In this embodiment, the charging speed α and the threshold value θ associated with the accumulation state of the capacitor 213 are set similarly to the first embodiment. That is, as the accumulation state of the capacitor 213, the total amount of weights accumulated in the capacitor 213 is estimated. The effective range E (the effective minimum value min to the effective maximum value max) is set for the total amount of accumulated weights on the basis of the estimation result.

As described in the first embodiment, the charging speed α and the threshold value θ are set on the basis of the set effective range E. As a result, it is possible to calculate the multiply-accumulate signal corresponding to the charges ($V^+$-$V^-$) with very high accuracy. As described above, even in the case where the positive and negative weight charges are input to the accumulation unit 211, it is possible to obtain the multiply-accumulate result.

Third Embodiment

Figure 13:
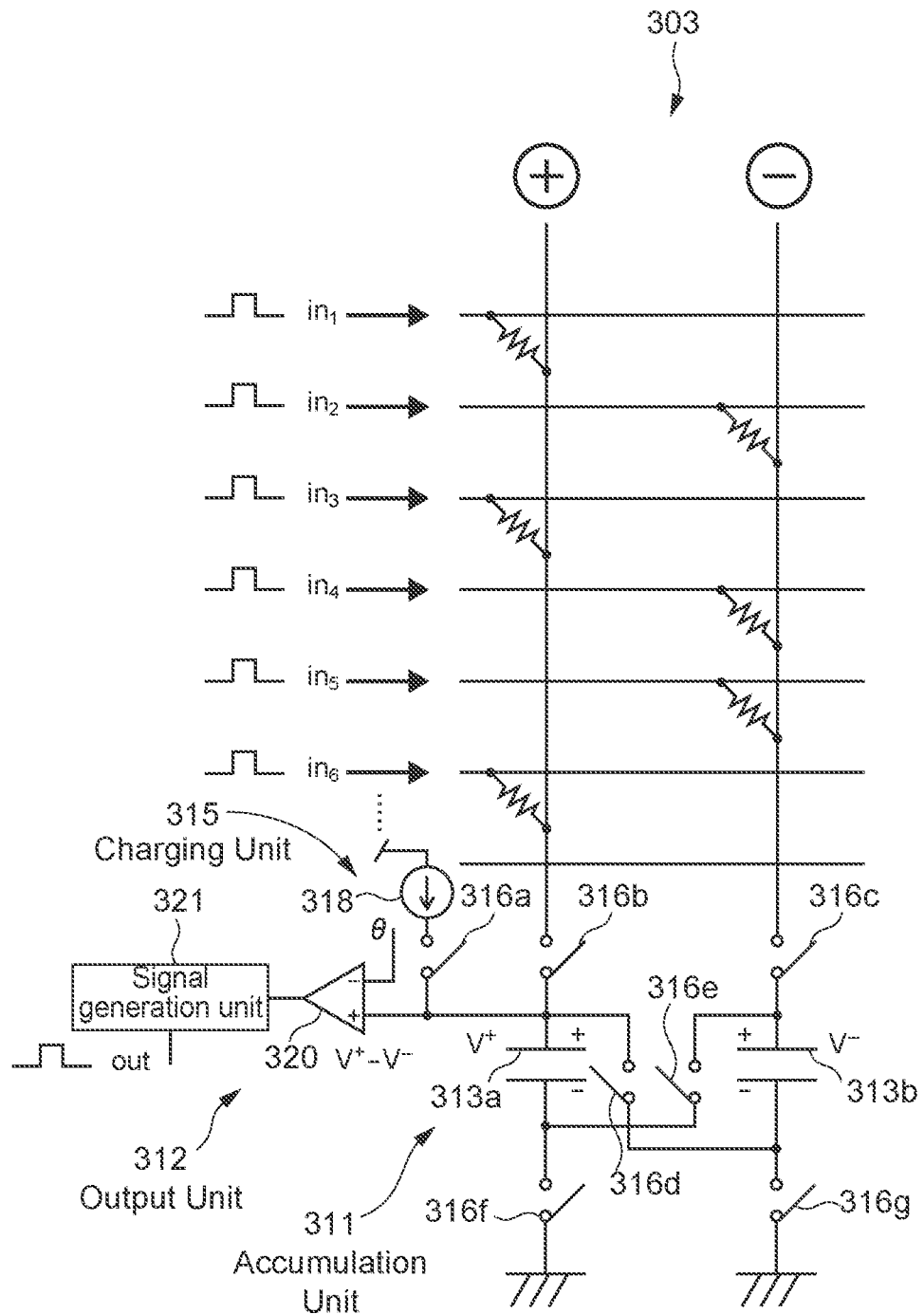
FIG. 13 is a schematic circuit diagram showing an example of a multiply-accumulate operation device according to a third embodiment.

FIG. 13 is a schematic circuit diagram showing an example of a multiply-accumulate operation device according to a third embodiment of the present technology.

In a multiply-accumulate operation device 303 according to this embodiment, a capacitor 313a in which positive weight charges are accumulated and a capacitor 313b in which negative weight charges are accumulated are connected in series in opposite directions. As a result, it is possible to hold charges ($V^+$-$V^-$) corresponding to the difference between the total amount of positive weight charges and the total amount of negative weight charges by an entire accumulation unit 311 as the terminal voltage of a combined capacitor.

At the start timing of the input period T, switches 316a, 316d, and 316e are turned OFF, and switches 316b, 316c, 316f, and 316g are turned ON. Then, an input signal is input within the input period T. Positive weight charges corresponding to the input signal are accumulated in the capacitor 313a, and negative weight charges corresponding to the input signal are accumulated in the capacitor 313b.

At the end timing $t_n$ of the input period T, the switches 316b, 316c, and 316f are switched OFF. Then, when the switch 316e is switched ON, the negative side of the capacitor 313a and the positive side of the capacitor 313b are connected to each other. As a result, the charges ($V^+$-$V^-$) are held by the two capacitors 313a and 313b.

Further, the switch 316a is switched ON, and the charging by a charging unit 315 (current source 318) is started. The timing when the voltage held by the capacitors 313a and 313b has become larger than the threshold value θ is detected by a comparator 320 of an output unit 312. The multiply-accumulate signal (PWM signal) is calculated on the basis of the detected timing by a signal generation unit 321. Note that the switch 316d is used to refresh the capacitor 313a.

Also in this embodiment, the charging speed α and the threshold value θ associated with the accumulation state of the capacitors 313a and 313b connected in series are set. That is, the total amount of weights accumulated in the capacitors 313a and 313b is estimated as the accumulation state of the capacitor 313 and 313b. The effective range E (the effective minimum value min to the effective maximum value max) is set for the total amount of accumulated weights on the basis of the estimation result.

The charging speed α and the threshold value θ are set on the basis of the set effective range E. As a result, it is possible to calculate the multiply-accumulate signal corresponding to the charges ($V^+$-$V^-$) with very high accuracy.

Fourth Embodiment

Figure 14:
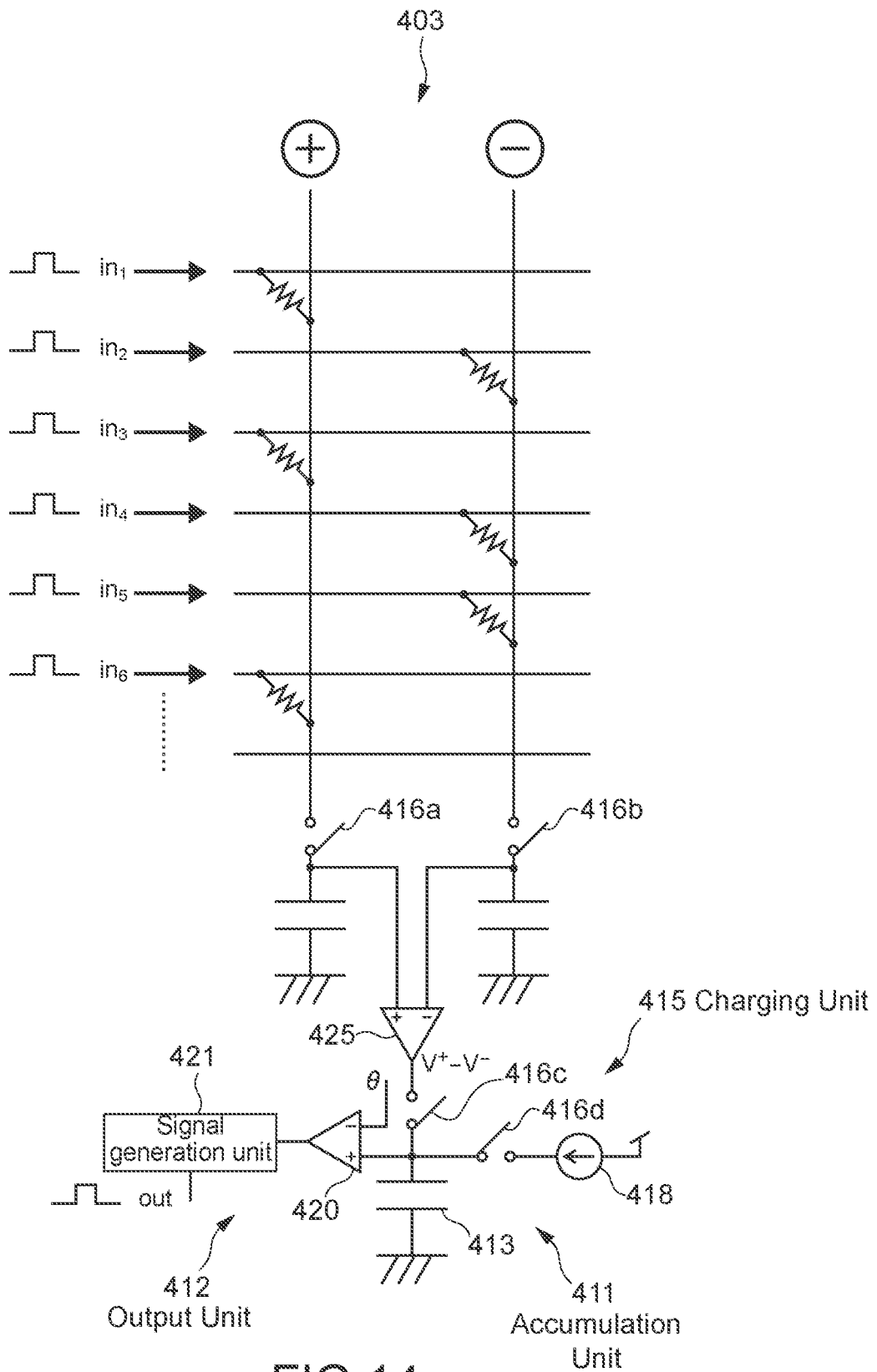
FIG. 14 is a schematic circuit diagram showing an example of a multiply-accumulate operation device according to a fourth embodiment.

FIG. 14 is a schematic circuit diagram showing an example of a multiply-accumulate operation device according to a fourth embodiment of the present technology.

In a multiply-accumulate operation device 403 according to this embodiment, a differential amplifier circuit 425 outputs the charges ($V^+$-$V^-$) corresponding to the difference between the total amount of positive weight charges and the total amount of negative weight charges, and the charges are accumulated in a capacitor 413 included in an accumulation unit 411. The specific configuration of the differential amplifier circuit 425 is not limited, and may be arbitrarily designed.

At the start timing of the input period T, switches 416a, 416b, and 416c are turned ON, and the switch 416b is turned OFF. Then, an input signal is input within the input period T. The charges ($V^+$-$V^-$) output by the differential amplifier circuit 425 are accumulated in the capacitor 413.

At the end timing $t_n$ of the input period T, the switch 416c is switched OFF and a switch 416d is switched ON. Then, at the end timing $t_n$ of the input period T, charging by a charging unit 415 (current source 418) is started.

Further, the timing when the voltage held by the capacitor 413 has become larger than the threshold value θ is detected by a comparator 420 of an output unit 412. The multiply-accumulate signal (PWM signal) is calculated on the basis of the detected timing by the signal generation unit 221.

Even in this embodiment, the charging speed α and the threshold value θ associated with the accumulation state of the capacitor 413 are set. That is, the total amount of weights accumulated in the capacitor 413 is estimated as the accumulation state of the capacitor 413. The effective range E (the effective minimum value min to the effective maximum value max) is set for the total amount of accumulated weights on the basis of the estimation result.

The charging speed α and the threshold value θ are set on the basis of the set effective range E. As a result, it is possible to calculate the multiply-accumulate signal corresponding to the charges ($V^+$-$V^-$) with very high accuracy.

Other Embodiments

The present technology is not limited to the embodiments described above, and various other embodiments can be realized.

Figure 15:
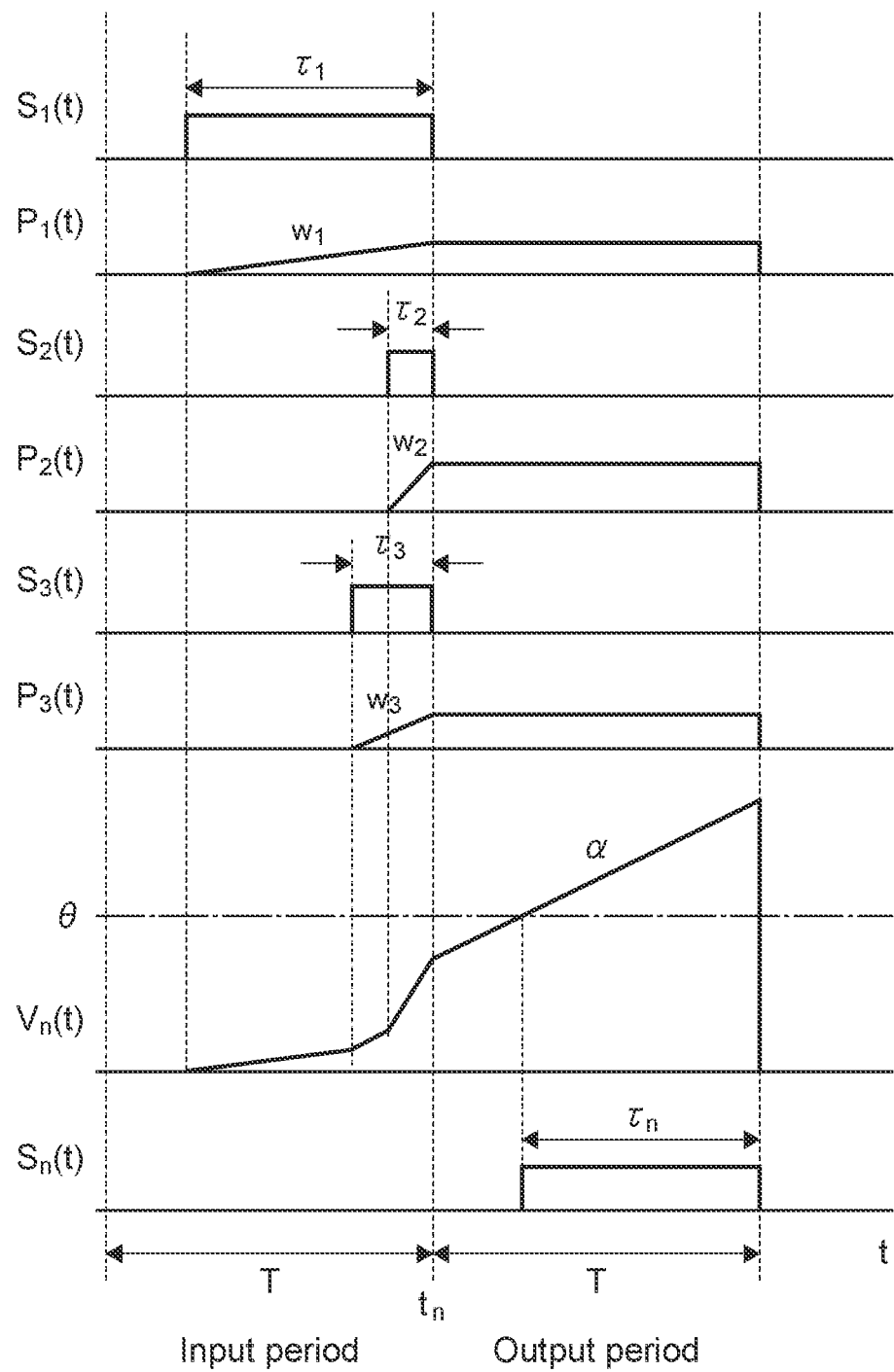
FIG. 15 is a schematic diagram showing another example of a pulse signal (PWM signal) having a pulse width corresponding to a signal value.

FIG. 15 is a schematic diagram showing another example of a pulse signal (PWM signal) having a pulse width corresponding to the signal value $x_i$. For example, the pulse is raised at the timing corresponding to the signal value $x_i$, and the pulse is lowered at the end timing $t_n$ of the input period T. That is, a pulse signal having a pulse width corresponding to the period from the timing corresponding to the signal value $x_i$ in the input period T to the end timing $t_n$ of the input period T is generated. The present technology is also applicable even in the case where such a pulse signal is used as an input signal.

That is, appropriately setting the falling timing of the pulse with respect to the spike timing signal makes it possible to apply the present technology as a pulse signal (PWM signal) having a pulse width corresponding to the signal value $x_i$.

As the setting of the charging speed α and the threshold value θ, α is set to θ/T for the output period T. As a result, the constant defined by the charging speed α, the threshold value θ, and the output period T included in formulae (Math. 6), (Math. 7), (Math. 10), and (Math. 11) can be made zero, and the processing can be simplified.

As the effective maximum value and the effective minimum value of the effective range, the theoretical maximum value and the theoretical minimum value obtained from the theoretical value of charges corresponding to the sum of multiplication values accumulated by the accumulation unit may be adopted. For example, after the respective weights are set by learning processing, the sum of charges accumulated in the case where the input signals corresponding to the maximum value of the input are input to all input lines is calculated as the theoretical maximum value. Further, the sum of charges accumulated in the case where input signals corresponding to the minimum value of the input are input to all input lines is calculated as the theoretical minimum value. It goes without saying that the method of calculating the theoretical maximum value and the theoretical minimum value is not limited.

Figure 16:
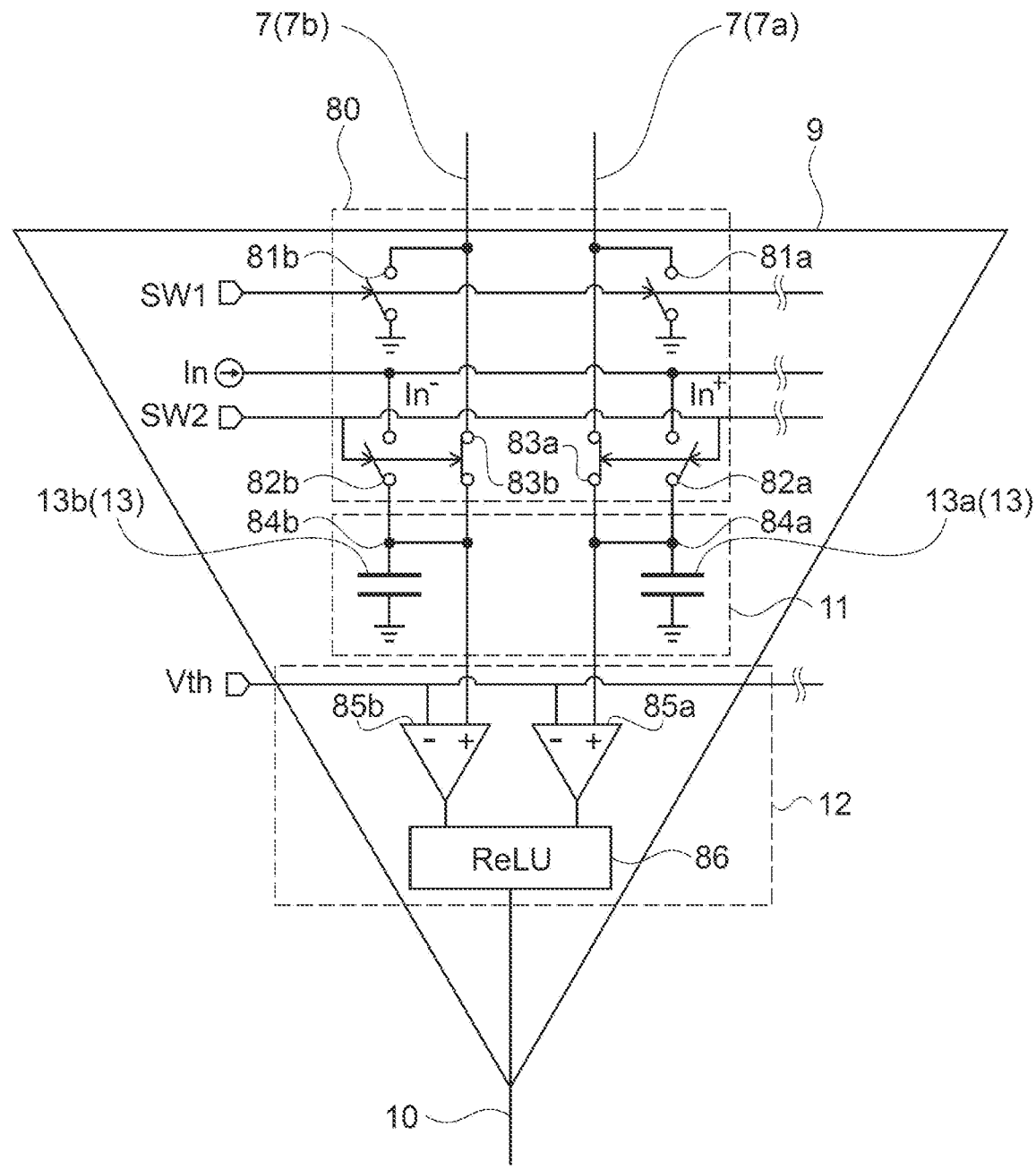
FIG. 16 is a circuit diagram showing a specific configuration example of the neuron circuit shown in FIG. 4.

FIG. 16 is a circuit diagram showing a specific configuration example of the neuron circuit 9 shown in FIG. 4. The neuron circuit 9 shown in FIG. 16 is a circuit that charges the capacitor 13 at a constant charging speed after the input period T. Further, the neuron circuit 9 outputs one multiply-accumulate result from a single output signal line 10 (referred to as the signal line 1b in FIG. 4) by receiving a pair of positive and negative outputs from the pair of output lines 7 as inputs, similarly to FIG. 4. In FIG. 16, a case where charges generated by the PWM signal are input to the neuron circuit 9 will be described.

In the following, the input period T is referred to as $T_{in}$, and the output period in which a multiply-accumulate signal is generated after the input period $T_{in}$ is referred to as $T_{out}$ in some cases. Note that the input period $T_{in}$ and the output period $T_{out}$ are typically periods set to the same consecutive length T ($T_{in}$-$T_{out}$=T).

The neuron circuit 9 includes a charging unit 80 in addition to the accumulation unit 11 and the output unit 12 shown in FIG. 4. The charging unit 80 charges the capacitor 13 at a constant charging speed in the output period $T_{out}$ after the input period $T_{in}$. As described above, the PWM signal is a signal representing a signal value by a pulse width within the input period $T_{in}$, and all the PWM signals are zero after the input period $T_{in}$ (see FIG. 2). Therefore, in the output period $T_{out}$, charges output to each of the output line 7 are substantially zero. The charging unit 80 shown in FIG. 4 operates in this output period Taut so as to connect the capacitor 13 to a predetermined current line In to charge the capacitor 13.

The charging unit 80 includes a first selector switch 81a, a second selector switch 82a, and a third selector switch 83a for changing the connection destination of the capacitor 13a, and a first selector switch 81b, a second selector switch 82b, and a third selector switch 83b for changing the connection destination of the capacitor 13b. Further, a first control line SW1, a second control line SW2, and the current line In are connected to the charging unit 80. Note that the connection state (ON or OFF) of each of the selector switches shown in FIG. 16 represents a connection state in the input period $T_{in}$.

The first selector switch 81a is connected between a positive output line 7a (positive charge output line) and a GND in the upstream from the capacitor 13a. The second selector switch 82a is connected between the current line In and an output node 84a of the capacitor 13a. Here, the output node 84a is a node (terminal) on the side opposite to the side of the capacitor 13a connected to a GND. The third selector switch 83a is provided between the output node 84a (the capacitor 13a) and the positive output line 7a. Further, the output node 84a is connected to the output unit 12 of a subsequent stage.

The first selector switch 81b is connected between a negative output line 7b (negative charge output line) and a GND in the upstream from the capacitor 13b. The second selector switch 82b is connected between the current line In and an output node 84b of the capacitor 13b. The third selector switch 83b is provided between the output node 84b (the capacitor 13b) and the negative output line 7b. Further, the output node 84b is connected to the output unit 12 of a subsequent stage.

The first control line SW1 controls the first selector switches 81a and 81b. The second control line SW2 controls the second selector switches 82a and 82b and the third selector switches 83a and 83b. Note that the second selector switch 82a (82b) and the third selector switch 83a (83b) are configured so that the ON/OFF states thereof are opposite to each other. In the case where one of them is ON, the other is OFF. The specific configuration of each of the selector switches is not limited, and, for example, an analogue switch using a CMOS circuit or the like may be used. Further, a control signal for operating the selector switch is appropriately input to each of the control lines.

The output unit 12 outputs a multiply-accumulate signal by performing threshold determination on the potential of the capacitor 13 in the output period $T_{out}$. Here, the potential of the capacitor 13 is the potential of each of the output nodes 84a and 84b of the capacitors 13a and 13b. Specifically, threshold determination of a potential difference (voltage) between the potential of each of the output nodes 84a and 84b and the GND potential is performed. In the following, the potential of each of the output nodes 84a and 84b with reference to the GND will be referred to simply as the voltage in some cases.

The output unit 12 includes positive and negative comparators 85a and 85b and a ReLU function circuit 86. Further, the output unit 12 is connected to a threshold voltage line Vth that supplies a predetermined threshold voltage. The positive comparator 85a (negative comparator 85b) is connected to the output node 84a (the output node 84b) and the threshold voltage line Vth, and switches the output level from Low to High in the case where the voltage of the output node 84a (the output node 85b) exceeds the threshold value θ (threshold voltage). The specific configuration of each of the comparators 85a and 85b is not limited.

Note that the value of the threshold value θ set to the threshold voltage line Vth is set, for example, during the output period $T_{out}$, together with the charging speed α of the capacitor 13 so that the positive and negative multiply-accumulate results can be properly detected. Specifically, as described in the above-mentioned embodiment, the charging speed α and the threshold value θ associated with the accumulation state of the capacitor 13 are appropriately set. Alternatively, the threshold value θ may be set in accordance with the capacitance of the capacitor 13, or the like. In addition, the method of setting the threshold value θ, and the like are not limited.

The ReLU function circuit 86 is a circuit that implements the ReLU function described with reference to FIG. 1. The ReLU function circuit 86 can be configured using, for example, a logical circuit. Further, the ReLU function circuit 86 functions as the function circuit 5 shown in FIG. 1 and the like. That is, it can be said that the neuron circuit 9 shown in FIG. 16 includes the function circuit 5.

Figure 17:
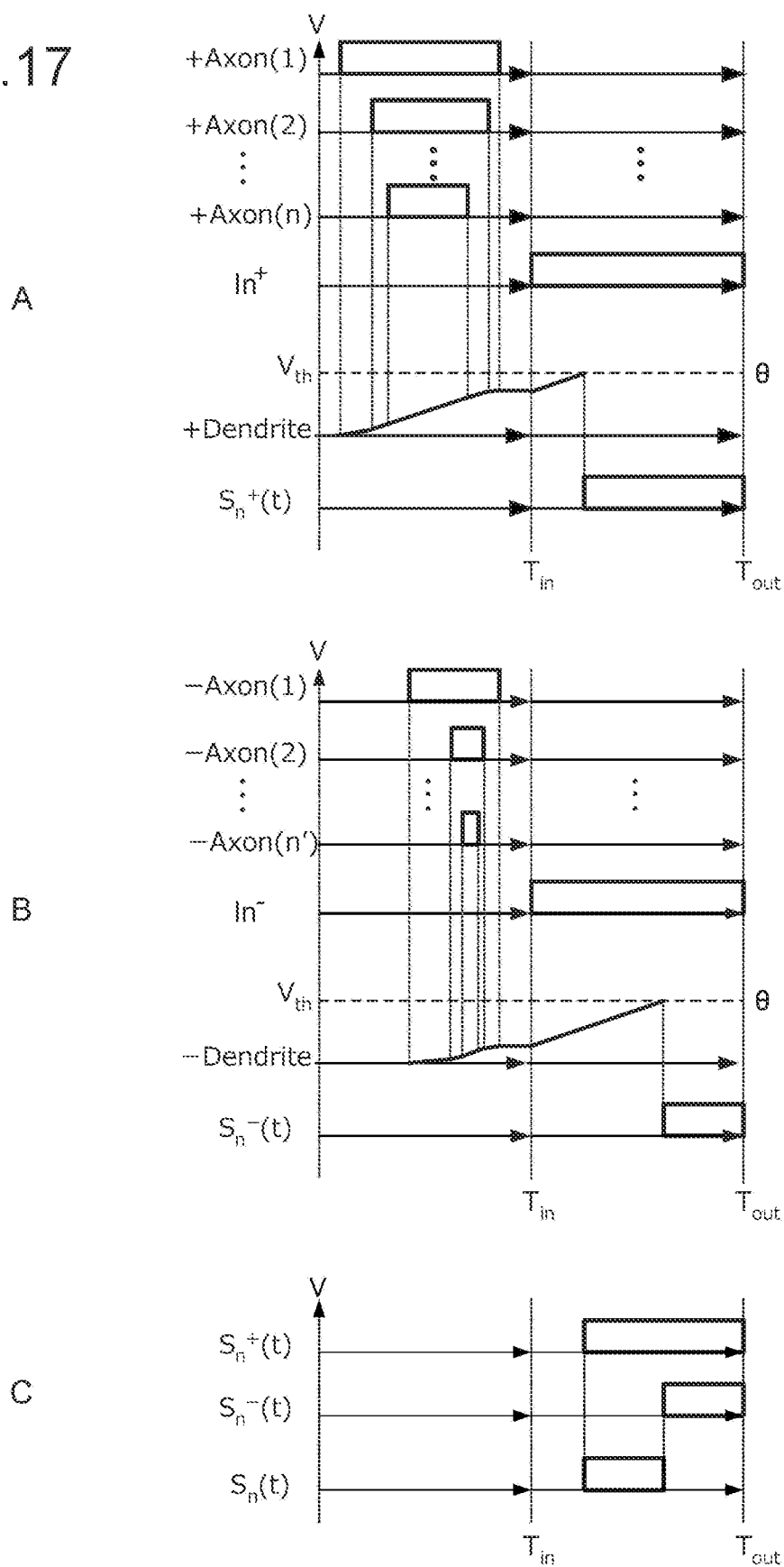
FIG. 17 is a timing chart showing an operation example of the neuron circuit shown in FIG. 16.

FIG. 17 is a timing chart showing an operation example of the neuron circuit 9 shown in FIG. 16. Part A of FIG. 17 and Part B of 17 are respectively timing charts showing multiply-accumulate operations for a positive weight value and a negative weight value. Further, Part C of FIG. 17 is a timing chart showing the operation of the ReLU function circuit 86. Hereinafter, an operation example of the neuron circuit 9 will be described with reference to FIG. 16 and FIG. 17.

First, before the input period $T_{in}$ is started, the first selector switches 81a and 81b are each set to the ON state by the first control line SW1, and the output lines 7a and 7b are grounded to the GNDs. At this time, the second selector switches 82a and 82b are each in the OFF state. Further, the third selector switches 83a and 83b are each in the ON state, and the capacitors 13a and 13b are respectively connected to the positive and negative output lines 7a and 7b. That is, the charging unit 80 connects the capacitor 13 to the GND before the input period $T_{in}$ is started.

As a result, the output lines 7a and 7b can be initialized to the GND level (installation level) and reset as the initial state before a multiply-accumulate operation is performed. As a result, charges accumulated in the capacitor 13 and charges accumulated in the parasitic capacitance of the output line 7, or the like, are discharged to the GND. As a result, charges or the like accumulated in the previous operation are reset, and thus, it is possible to repeatedly execute the appropriate arithmetic processing.

Note that when the resetting of charges is completed, the first selector switches 81a and 81b are each set to the OFF state by the first control line SW1. Further, the second selector switches 82a and 82b are each maintained in the OFF state, and the third selector switches 83a and 83b are each maintained in the ON state. In this state, the input period $T_{in}$ is started. Thus, the charging unit 80 connects the capacitor 13 to the pair of output lines 7a and 7b in the input period $T_{in}$.

In the input period $T_{in}$, PWM signals are input from a plurality of input signal lines 6 (Axon lines), and the respective capacitors 13a and 13b are charged. For example, in the input period $T_{in}$, a plurality of PWM signals (input signals) is input to each of the output lines 7a and 7b via each of the synapse circuits 8 (weights). Hereinafter, signals input to the positive and negative output lines 7a and 7b will be referred to as ±Axon(n).

For example, as shown in Part A of FIG. 17, PWM signals from +Axon(1) to +Axon(n) are input to the positive the output line 7a. As a result, the capacitor 13a on the positive side is charged in accordance with the pulse width (signal value) of each PWM signal, and the voltage (+Dendrite) of the capacitor 13a is increased in accordance with the input of each PWM signal for the positive output line 7a. Similarly, as shown in Part B of FIG. 17, PWM signals from −Axon(1) to −Axon(n') are input to the negative output line 7b. As a result, the voltage (-Dendrite) of the capacitor 13a on the negative side is increased in accordance with the input of each PWM signal for the negative output line 7a. Note that all PWM signals are input before the input period $T_{in}$ is ended.

When the input period $T_{in}$ is ended, the output period $T_{out}$ is started continuously thereto. At the timing when the output period $T_{out}$ is started, the third selector switches 83a and 83b are each set to the OFF state by the second control line SW2. As a result, the output lines 7a and 7b are separated from the subsequent stage (the accumulation unit 11 and the output unit 12) of the neuron circuit 9.

Further, at substantially the same time, the second selector switches 82a and 82b are each set to the ON state, and the current line In is connected to the capacitors 13a and 13b. As a result, the capacitors 13a and 13b are charged by the current line In. Specifically, as shown in Part A of FIG. 17 and Part B of 17, In$^+$ and In$^-$ flow into the capacitors 13a and 13b by connecting to the current line In.

In this embodiment, the current line In function as a constant current source. Therefore, the currents (In$^+$ and In$^-$) flowing into the respective capacitors 13a and 13b have the same value. These currents cause the capacitors 13a and 13b to be charged at a constant charging speed α. Thus, the charging unit 80 connects the capacitor 13 to the current line In that supplies a current corresponding to the constant charging speed α in the output period $T_{out}$. As a result, it is possible to easily detect charges accumulated in the input period $T_{in}$ accurately by threshold determination. In the example shown in FIG. 16, the current line In corresponds to the current source.

For example, as shown in Part A of FIG. 17 and Part B of FIG. 17, the ±Dendrite, which are the voltages of the capacitors 13a and 13b, increase at a constant rate at the beginning of the output period $T_{out}$ (the end of the input period $T_{in}$) by being connected to the current line In. The slopes of this increases are equal to each other between the capacitors 13a and 13b. As a result, for example, the timing when the ±Dendrite exceed the threshold value θ represents the voltage at the end timing of the input period $T_{in}$ of each of the capacitors 13a and 13b. As a result, charges accumulated in the input period $T_{in}$, i.e., positive and negative multiply-accumulate results can be properly represented.

The current line In supplies current until the ±Dendrite reach the threshold value θ. Then, when the ±Dendrite reach the threshold value θ, the output signals $S_n^+(t)$ and $S_n^-(t)$ are respectively generated from the comparators 85a and 85b. $S_n^+(t)$ and $S_n^-(t)$ are multiply-accumulate signals respectively representing a positive multiply-accumulate result and a negative multiply-accumulate result.

In the example shown in FIG. 17, since the voltage of the capacitor 13a at the end timing of the input period $T_{in}$ is higher than that of the capacitor 13b, $S_n^+(t)$ is generated earlier than $S_n^-(t)$. As described above, the signal output from the comparator is a signal having the larger accumulate result as the rising timing is earlier.

The signals ($S_n^+(t)$ and $S_n^-(t)$) representing positive and negative multiply-accumulate results are input to the ReLU function circuit 86, and the difference between them is output as the PWM signal $S_n(t)$. As shown in Part C of FIG. 17, $S_n(t)$ is a signal that is High when $S_n^+(t)$ is High and $S_n^-(t)$ is low. The pulse width of $S_n(t)$ represents the difference between the positive and negative multiply-accumulate results, i.e., the final result of the multiply-accumulate operation output from one analog circuit 3. Note that $S_n(t)$ is generated only in the case where $S_n^+(t)>S_n^-(t)$ (in the case where the difference between the positive and negative multiply-accumulate results is 0 or more).

Thus, in the neuron circuit 9 shown in FIG. 16, it is possible to output the multiply-accumulate result processed by the ReLU function. Note that the present technology is not limited to the circuit shown in FIG. 16, and an arbitrary circuit capable of reading charges or the like accumulated in the capacitor 13 may be used as the neuron circuit 9.

Figure 18:
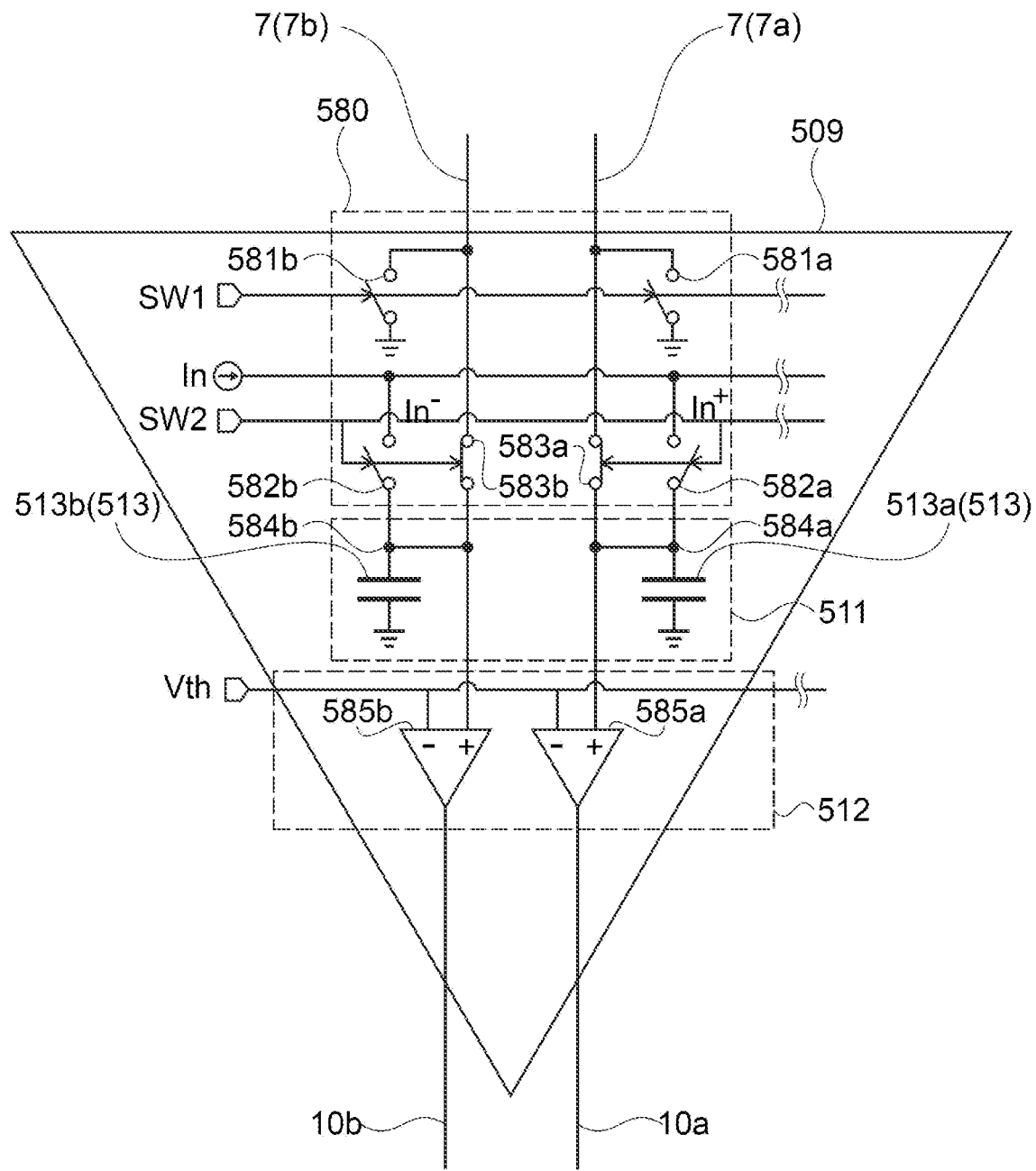
FIG. 18 is a circuit diagram showing another configuration example of the neuron circuit.

FIG. 18 is a circuit diagram showing another configuration example of a neuron circuit 509. The neuron circuit 509 shown in FIG. 18 is a circuit that charges a capacitor 513 at the constant charging speed α after the input period $T_{in}$. Further, the neuron circuit 509 receives a pair of positive and negative outputs from the pair of output lines 7 as inputs, and outputs positive and negative multiply-accumulate results from a pair of output signal lines 10a and 10b. In FIG. 18, a case where charges generated by a signal (step signal) of a TACT system (spike timing system) is input to the neuron circuit 509 will be described.

The neuron circuit 509 includes a charging unit 580 in addition to an accumulation unit 511 and the output unit 512. The accumulation unit 511 and the charging unit 580 have, for example, the same configuration as that of the charging unit 80 described with reference to FIG. 16. Note that in the neuron circuit 509 shown in FIG. 18, a pair of multiply-accumulate signals $S_n^+(t)$ and $S_n^-(t)$ representing positive and negative multiply-accumulate results are output as they are from comparators 585a and 585b of the output unit 512, respectively. That is, it can be said that the output unit 512 has a configuration obtained by removing the ReLU function circuit 86 from the output unit 12 shown in FIG. 16.

The charging unit 580 charges the capacitor 513 at the constant charging speed α in the output period T out after the input period $T_{in}$. As described above, the step signal is a signal representing a signal value by timing in the input period $T_{in}$. Here, a signal representing a signal value by the timing rising from low to High in the input period $T_{in}$ is used. Note that the rising step signal continues to maintain the High level thereafter.

Figure 19:
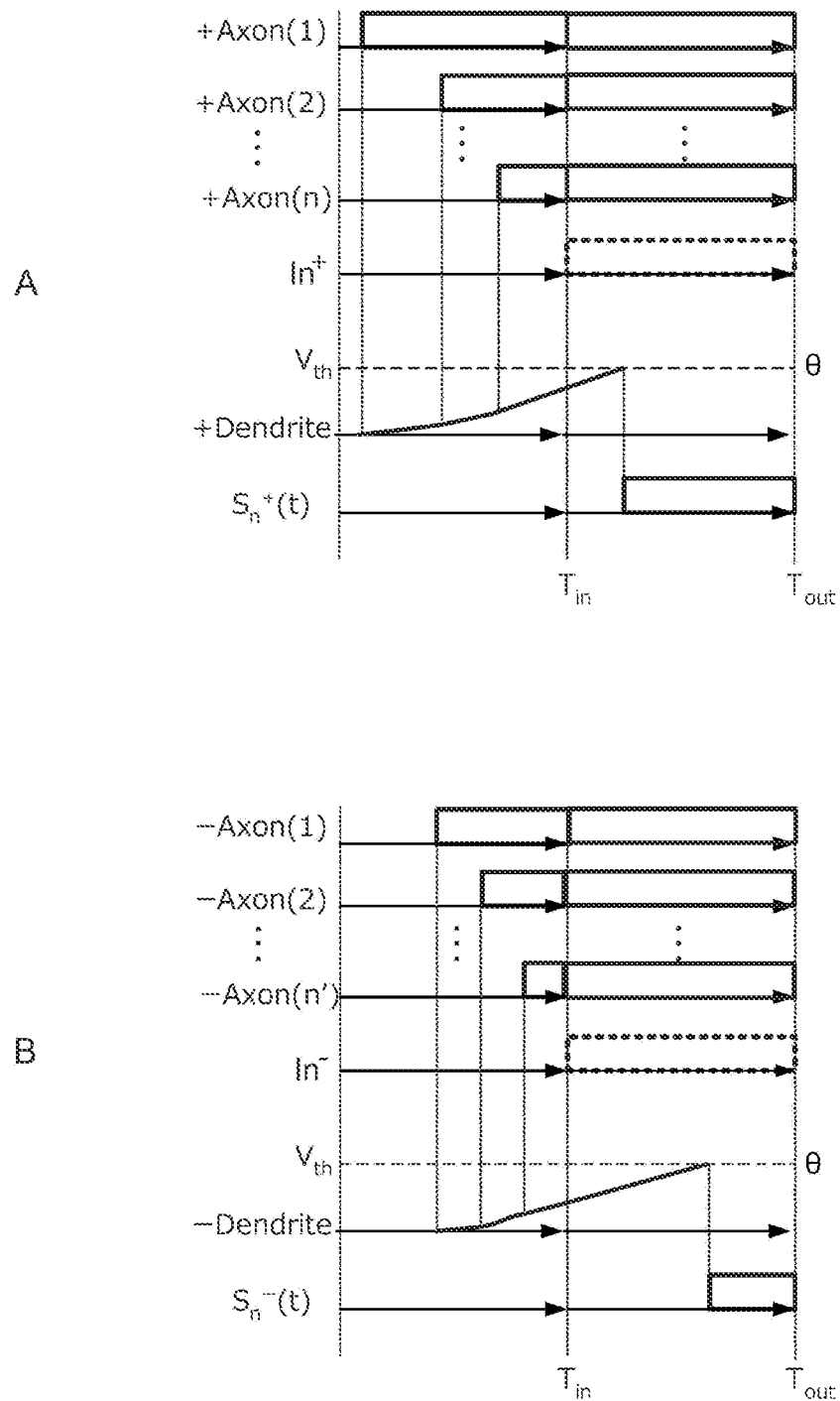
FIG. 19 is a timing chart showing an operation example of the neuron circuit shown in FIG. 18.

FIG. 19 is a timing chart showing an operation example of the neuron circuit 509 shown in FIG. 18. Part A of FIG. 19 and Part B of FIG. 19 are timing charts respectively showing multiply-accumulate operations for a positive weight value and a negative weight value.

In FIG. 19, the step signal is maintained at a High level even after completion of the input period $T_{in}$ (during the output period $T_{out}$). These step signals charge the capacitor 513 during the output period $T_{out}$. That is, during the output period $T_{out}$, the plurality of input signal lines 6 (Axon lines) and the output line 7 constitute a current source, and the capacitor 13 is charged. Note that in FIG. 19, assumption is made that the numbers of ±Axon lines are equal to each other (n=n'). As a result, the charging speed α in the output period $T_{out}$ of the capacitors 513a and 513b can be equalized.

Therefore, in FIG. 19, the respective Axon lines and the positive and negative output lines 7a and 7b function as a part of the charging unit 580. In this case, for example, the neuron circuit 509 can be operated in a configuration in which second selector switches 582a and 582b and the current line In shown in FIG. 18 are excluded and third selector switches 583a and 583b are short-circuited. As a result, the circuit configuration for charging the capacitor 513 can be simplified.

First, first selector switches 581a and 581b are each set to the ON state by the first control line SW1 while the positive and negative output lines 7a and 7b and the capacitors 513a and 513b are connected (third selector switches 583a and 583b are short-circuited) before the input period $T_{in}$ is started. As a result, before a multiply-accumulate operation is performed, the output lines 7a and 7b and the like can be initialized to the GND level (installation level) and reset.

In the input period $T_{in}$, step signals that rise at timing corresponding to the signal value are input to the plurality of Axon lines. In the TACT system, a signal that maintains a High level is input from all of the Axon lines subsequently after the input period $T_{in}$. That is, there is a variation in the timing at when the step signal is input in the input period $T_{in}$, but all of the Axon lines are at the High level and constant charges are continuously supplied in the output period $T_{in}$. As a result, the capacitors 513a and 513b can be charged at a constant charging speed.

The voltages of output nodes 584a and 584b of the capacitors 513a and 513b each increase at a constant rate. Then, when the voltages (±Dendrite) of the output nodes 584a and 584b reach the threshold value θ (threshold voltage) of the comparators 585a and 585b, positive and negative multiply-accumulate signals $S_n^+(t)$ and $S_n^-(t)$ are generated, respectively. The generated $S_n^+(t)$ and $S_n^-(t)$ are output to a subsequent stage as a pair of multiply-accumulate signals. As described above, by using the step signal of the TACT system, a multiply-accumulate signal representing the multiply-accumulate result can be generated with a simple configuration.

Figure 20:
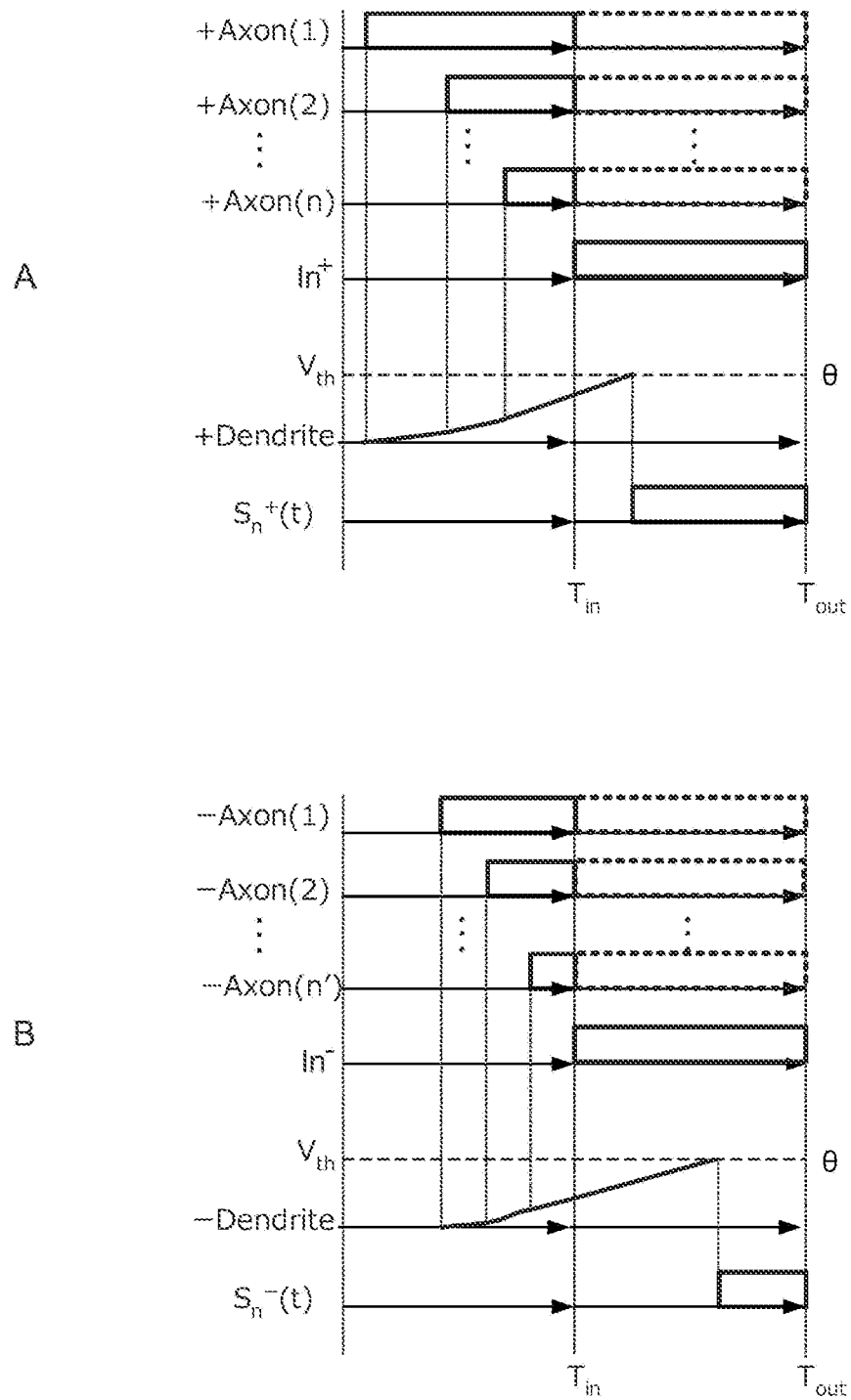
FIG. 20 is a timing chart showing another operation example of the neuron circuit shown in FIG. 18.

FIG. 20 is a timing chart showing another operation example of the neuron circuit 509 shown in FIG. 18. Part A of FIG. 20 and Part B of FIG. 20 are respectively timing charts showing multiply-accumulate operations for a positive weight value and a negative weight value. In FIG. 20, the positive and negative output lines 7a and 7b are separated after the end of the input period $T_{in}$. Then, during the output period $T_{out}$, the capacitor 513 is charged by the current line In.

After each of the output lines 7a and 7b and the like is reset to the initial state, the input period $T_{in}$ is started and a plurality of step signals are input. At this time, the selector switches 582a and 582b are set to the OFF state, and the third selector switches 583a and 583b are set to the ON state. As a result, charges corresponding to the signal value of the step signal are accumulated in the capacitors 513a and 513b from the positive and negative output lines 7a and 7b.

In FIG. 20, at the timing when the input period $T_{in}$ is ended, the third selector switches 583a and 583b are set to the OFF state by the second control line SW2, and the output lines 7a and 7b are separated from the subsequent stage (the accumulation unit 511 and the output unit 512) of the neuron circuit 509. As a result, as shown in Part A of FIG. 20 and Part B of FIG. 20, the input from each of the Axon lines is cut in the output period $T_{out}$.

Further, the second selector switches 582a and 582b are set to the ON state at substantially the same time when the output lines 7a and 7b are separated. As a result, each of the capacitors 513a and 513b are connected to the current line In and supplied with the constant currents In⁺ and In⁻, respectively. As a result, the capacitors 513a and 513b are charged at a constant charging speed. Further, when the voltages (±Dendrite) of the output nodes 584a and 584b reach the threshold value θ of the comparators 585a and 585b, positive and negative multiply-accumulate signals $S_n^+(t)$ and $S_n^-(t)$ are generated, respectively.

As described above, even in the case where the TACT system is used, a multiply-accumulate signal representing the multiply-accumulate result can be generated using the current line In. As a result, for example, the neuron circuit 509 for the TACT system can be easily configured by using the designing of the neuron circuit 9 (see FIG. 16) used in the PWM system.

In the above description, the case of outputting a multiply-accumulate signal on the basis of the timing when the voltage held by the accumulation unit increases over the threshold value has been exemplified. However, a configuration of outputting a multiply-accumulate signal on the basis of the timing when the voltage held by the accumulation unit has become smaller than a threshold voltage may be employed. For example, charging is performed in advance until the voltage of the capacitor that functions as an accumulation unit reaches a predetermined preset value. Then, after the sum of charges corresponding to the multiplication value of a signal value and a weight value is accumulated, the capacitor is discharged at a predetermined rate. In such a case, a multiply-accumulate signal can be output on the basis of the timing when the voltage held by the capacitor has become smaller than a threshold value. It goes without saying that the present technology is not limited to such a configuration. Note that in the present disclosure, discharging a capacitor is included in charging negative charges to the capacitor. By appropriately setting the threshold value and the discharging speed, it is possible to calculate the multiply-accumulate signal with very high accuracy.

In the above description, the case where a pair of output lines is used has been described. The present technology is not limited thereto, and three or more output line may be provided. That is, the present technology described above is applicable even in the case where an arbitrary number, greater than or equal to one, of output lines are used. For example, a multiplication unit includes a resistor that is connected between a corresponding input line and any one of the one or more output lines and defines a weight value, and outputs charges corresponding to the multiplication value to the output line to which the resistor is connected. It goes without saying that the present technology is not limited thereto.

The configurations of the arithmetic logic unit, multiply-accumulate operation device, analog circuit, synapse circuit, neuron circuit, and the like, the method of generating a multiply-accumulate signal, and the like described with reference to the drawings are merely one embodiment, and can be arbitrarily modified without departing from the essence of the present technology. That is, any other arbitrary configuration, method, and the like for carrying out the present technology may be employed.

In the present disclosure, "same", "equal", "perpendicular", and the like are concepts including "substantially the same", "substantially equal", "substantially perpendicular", and the like. For example, the states included in a predetermined range (e.g., ±10%) with reference to "completely the same", "completely equal", "completely perpendicular", and the like are also included.

At least two features of the above-mentioned features according to the present technology may be combined. That is, various features described in each embodiment may be arbitrarily combined without distinguishing the embodiments with each other. Further, the various effects described above are merely examples and are not limited, and additional effects may be exerted.

It should be noted that the present technology may take the following configurations.

(1) A multiply-accumulate operation device that executes a multiply-accumulate operation with an analog circuit, including:

a plurality of input lines, pulse signals having pulse widths corresponding to input values being input to the plurality of input lines;

a plurality of multiplication units that generates, on a basis of the pulse signals input to each of the plurality of input lines, charges corresponding to multiplication values obtained by multiplying the input values by weight values;

an accumulation unit that accumulates a sum of the charges corresponding to the multiplication values generated by each of the plurality of multiplication units;

a charging unit that charges, at a charging speed associated with an accumulation state of the accumulation unit, the accumulation unit in which the sum of the charges corresponding to the multiplication values have been accumulated; and an output unit that outputs a multiply-accumulate signal representing a sum of the multiplication values by executing threshold determination using a threshold value associated with the accumulation state of the accumulation unit on a voltage held by the accumulation unit after the charging by the charging unit is started.

(2) The multiply-accumulate operation device according to (1), in which the pulse signal is input to each of the plurality of input lines within an input period having a predetermined length, the charging unit starts the charging after the input period is ended, and the output unit outputs the multiply-accumulate signal on a basis of timing at which the voltage held by the accumulation unit increases or decreases over the threshold value within an output period having a predetermined length.

(3) The multiply-accumulate operation device according to (2), in which the charging speed and the threshold value are set on a basis of an effective maximum value and an effective minimum value of the sum of the charges corresponding to the multiplication values, the effective maximum value and the effective minimum value being obtained from an estimation result of the sum of the charges corresponding to the multiplication values accumulated by the accumulation unit.

(4) The multiply-accumulate operation device according to (3), in which the charging speed and the threshold value are set so that a range from the effective maximum value to the effective minimum value is a range in which the multiply-accumulate signal can be output in the output period.

(5) The multiply-accumulate operation device according to (3) or (4), in which the timing at which the voltage held by the accumulation unit increases or decreases over the threshold value is used as calculation timing for calculating the multiply-accumulate signal, and the charging speed and the threshold value are set so that the calculation timing corresponding to the effective maximum value is timing immediately after start timing of the output period and the calculation timing corresponding to the effective minimum value is timing immediately before end timing of the output period.

(6) The multiply-accumulate operation device according to any one of (3) to (5), in which the charging speed and the threshold value are set on a basis of a length of the output period.

(7) The multiply-accumulate operation device according to any one of (3) to (6), in which the effective maximum value and the effective minimum value are respectively a theoretical maximum value and a theoretical minimum value obtained from a theoretical value of the sum of the charges corresponding to the multiplication values accumulated by the accumulation unit.

(8) The multiply-accumulate operation device according to any one of (2) to (7), in which the length of the output period is equal to a length of the input period.

(9) The multiply-accumulate operation device according to any one of (2) to (8), in which the charging unit starts the charging at end timing of the input period, and the output period is started at start timing of the charging by the charging unit.

(10) The multiply-accumulate operation device according to any one of (1) to (9), in which the plurality of multiplication units includes a positive weight multiplication unit that generates positive weight charges corresponding to a multiplication value obtained by multiplying the input value by a positive weight value, and a negative weight multiplication unit that generates negative weight charges corresponding to a multiplication value obtained by multiplying the input value by a negative weight value, the accumulation unit includes a positive charge accumulation unit that accumulates a sum of the positive weight charges generated by the positive weight multiplication unit, and a negative charge accumulation unit that accumulates a sum of the negative weight charges generated by the negative weight multiplication unit, the charging unit charges the positive charge accumulation unit and the negative charge accumulation unit at the same charging speed, and the output unit outputs the multiply-accumulate signal by executing threshold determination using the same threshold value on the positive charge accumulation unit and the negative charge accumulation unit.

(11) The multiply-accumulate operation device according to any one of (1) to (9), in which the accumulation unit accumulates charges corresponding to a difference between a total amount of positive weight charges corresponding to the multiplication value obtained by multiplying the input value by a positive weight value and a total amount of negative weight charges corresponding to the multiplication value obtained by multiplying the input value by a negative weight value.

(12) The multiply-accumulate operation device according to (11), in which the positive weight charges and the negative weight charges are charges with the same sign as each other, and the accumulation unit accumulates a sum of the positive weight charges and discharge a sum of the negative weight charges.

(13) The multiply-accumulate operation device according to any one of (2) to (12), in which the pulse signal has a pulse width corresponding to a period from timing corresponding to the input value in the input period to end timing of the input period.

(14) The multiply-accumulate operation device according to any one of (1) to (13), further including one or more output lines, in which the plurality of multiplication units is provided corresponding to the plurality of input lines, and each of the plurality of multiplication units includes a resistor that defines the weight value and has non-linear characteristics, the resistor being connected between the corresponding input line of the plurality of input lines and any one of the one or more output lines, and outputs charges corresponding to the multiplication value to the output line to which the resistor is connected.

(15) The multiply-accumulate operation device according to (10), further including:
   a positive charge output line; and
   a negative charge output line, in which
   the plurality of multiplication units is provided corresponding to the plurality of input lines,
   the positive weight multiplication unit includes a resistor that defines the positive weight value and has non-linear characteristics, the resistor being connected between the corresponding input line of the plurality of input lines and the positive charge output line, and outputs positive weight charges corresponding to the multiplication value to the positive charge output line, and
   the negative weight multiplication unit includes a resistor that defines the negative weight value and has non-linear characteristics, the resistor being connected between the corresponding input line of the plurality of input lines and the negative charge output line, and outputs negative weight charges corresponding to the multiplication value to the negative charge output line.

(16) The multiply-accumulate operation device according to (14) or (15), in which
   the resistor is a fixed resistance element, a variable resistance element, or a MOS transistor that operates in a subthreshold region.

(17) A multiply-accumulate operation circuit that executes a multiply-accumulate operation by an analog system, including:
   a plurality of input lines, pulse signals having pulse widths corresponding to input values being input to the plurality of input lines;
   a plurality of multiplication units that generates, on a basis of the pulse signals input to each of the plurality of input lines, charges corresponding to multiplication values obtained by multiplying the input values by weight values;
   an accumulation unit that accumulates a sum of the charges corresponding to the multiplication values generated by each of the plurality of multiplication units;
   a charging unit that charges, at a charging speed associated with an accumulation state of the accumulation unit, the accumulation unit in which the sum of the charges corresponding to the multiplication values have been accumulated; and
   an output unit that outputs a multiply-accumulate signal representing a sum of the multiplication values by executing threshold determination using a threshold value associated with the accumulation state of the accumulation unit on a voltage held by the accumulation unit after the charging by the charging unit is started.

(18) A multiply-accumulate operation system, including:
   a plurality of input lines, pulse signals having pulse widths corresponding to input values being input to the plurality of input lines;
   a plurality of analog circuits including
      a plurality of multiplication units that generates, on a basis of the pulse signals input to each of the plurality of input lines, charges corresponding to multiplication values obtained by multiplying the input values by weight values,
      an accumulation unit that accumulates a sum of the charges corresponding to the multiplication values generated by each of the plurality of multiplication units,
      a charging unit that charges, at a charging speed associated with an accumulation state of the accumulation unit, the accumulation unit in which the sum of the charges corresponding to the multiplication values have been accumulated, and
      an output unit that outputs a multiply-accumulate signal representing a sum of the multiplication values by executing threshold determination using a threshold value associated with the accumulation state of the accumulation unit on a voltage held by the accumulation unit after the charging by the charging unit is started; and
   a network circuit to which the plurality of analog circuits is connected.

(19) A multiply-accumulate operation method, including:
   inputting pulse signals having pulse widths corresponding to input values to a plurality of input lines;
   generating, on a basis of the pulse signals input to each of the plurality of input lines, charges corresponding to multiplication values obtained by multiplying the input values by weight values;
   accumulating a sum of the generated charges corresponding to the multiplication values in an accumulation unit;
   charging the accumulation unit in which a sum of the charges corresponding to the multiplication values is accumulated at a charging speed associated with an accumulation state of the accumulation unit; and
   outputting a multiply-accumulate signal representing a sum of the multiplication values by executing threshold determination using a threshold value associated with the accumulation state of the accumulation unit on a voltage held by the accumulation unit after the charging is started.

REFERENCE SIGNS LIST $\theta$ threshold value
$\alpha$ charging speed
1 signal line
1*a* input signal line
3, 203, 303, 403 multiply-accumulate operation device
7 pair of output lines
7*a*, 207*a* positive charge output line
7*b*, 207*b* negative charge output line
8 synapse circuit
8*a*, 208*a* synapse circuit (positive weight multiplication unit)
8*b*, 208*b* synapse circuit (negative weight multiplication unit)
9, 509 neuron circuit
11, 211, 311, 411, 511 accumulation unit
12, 212, 312, 412, 512 output unit
13, 213, 313, 413, 513 capacitor
15, 215, 315, 415, 80, 580 charging unit
17 resistor
18, 218, 318, 418 current source
20, 220, 320, 420 comparator
21, 221, 321 signal generation unit
100 arithmetic logic unit

The invention claimed is:

1. A multiply-accumulate operation device that executes a multiply-accumulate operation with an analog circuit, comprising:
a plurality of input lines, pulse signals having pulse widths corresponding to input values being input to the plurality of input lines;
a plurality of multiplication units that generates, on a basis of the pulse signals input to each of the plurality of input lines, charges corresponding to multiplication values obtained by multiplying the input values by weight values;
an accumulation unit that accumulates a sum of the charges corresponding to the multiplication values generated by each of the plurality of multiplication units;
a charging unit that charges, at a charging speed associated with an accumulation state of the accumulation unit, the accumulation unit in which the sum of the charges corresponding to the multiplication values have been accumulated; and
an output unit that outputs a multiply-accumulate signal representing a sum of the multiplication values by executing threshold determination using a threshold value associated with the accumulation state of the accumulation unit on a voltage held by the accumulation unit after the charging by the charging unit is started, wherein
the charging speed and the threshold value are set on a basis of an effective maximum value and an effective minimum value of the sum of the charges corresponding to the multiplication values, and
the effective maximum value and the effective minimum value are obtained from an estimation result of the sum of the charges corresponding to the multiplication values accumulated by the accumulation unit.

2. The multiply-accumulate operation device according to claim 1, wherein
the pulse signals are respectively input to each of the plurality of input lines within an input period having a predetermined length,
the charging unit starts the charging after the input period is ended, and
the output unit outputs the multiply-accumulate signal on a basis of timing at which the voltage held by the accumulation unit increases or decreases over the threshold value within an output period having a predetermined length.

3. The multiply-accumulate operation device according to claim 2, wherein
a length of the output period is equal to a length of the input period.

4. The multiply-accumulate operation device according to claim 2, wherein
the charging unit starts the charging at end timing of the input period, and the output period is started at start timing of the charging by the charging unit.

5. The multiply-accumulate operation device according to claim 2, wherein
the pulse signals respectively have a pulse width corresponding to a period from timing corresponding to the input value in the input period to end timing of the input period.

6. The multiply-accumulate operation device according to claim 1, wherein
the charging speed and the threshold value are set so that a range from the effective maximum value to the effective minimum value is a range in which the multiply-accumulate signal can be output in the output period.

7. The multiply-accumulate operation device according to claim 1, wherein
the timing at which the voltage held by the accumulation unit increases or decreases over the threshold value is used as calculation timing for calculating the multiply-accumulate signal, and
the charging speed and the threshold value are set so that the calculation timing corresponding to the effective maximum value is timing immediately after start timing of the output period and the calculation timing corresponding to the effective minimum value is timing immediately before end timing of the output period.

8. The multiply-accumulate operation device according to claim 1, wherein
the charging speed and the threshold value are set on a basis of a length of the output period.

9. The multiply-accumulate operation device according to claim 1, wherein
the effective maximum value and the effective minimum value are respectively a theoretical maximum value and a theoretical minimum value obtained from a theoretical value of the sum of the charges corresponding to the multiplication values accumulated by the accumulation unit.

10. The multiply-accumulate operation device according to claim 1, wherein
the plurality of multiplication units includes a positive weight multiplication unit that generates positive weight charges corresponding to a multiplication value obtained by multiplying a respective one of the input values by a positive weight value, and a negative weight multiplication unit that generates negative weight charges corresponding to a multiplication value obtained by multiplying the respective one of the input values by a negative weight value,
the accumulation unit includes a positive charge accumulation unit that accumulates a sum of the positive weight charges generated by the positive weight multiplication unit, and a negative charge accumulation unit that accumulates a sum of the negative weight charges generated by the negative weight multiplication unit,
the charging unit charges the positive charge accumulation unit and the negative charge accumulation unit at the same charging speed, and the output unit outputs performs the executing of the threshold determination using the same threshold value on the positive charge accumulation unit and the negative charge accumulation unit.

11. The multiply-accumulate operation device according to claim 10, further comprising:
a positive charge output line; and a negative charge output line, wherein
the plurality of multiplication units is provided corresponding to the plurality of input lines,
the positive weight multiplication unit includes a resistor that defines the positive weight value and has non-linear characteristics, the resistor being connected between the corresponding input line of the plurality of input lines and the positive charge output line, and outputs positive weight charges corresponding to the multiplication value to the positive charge output line, and the negative weight multiplication unit includes a resistor that defines the negative weight value and has non-linear characteristics, the resistor being connected between the corresponding input line of the plurality of input lines and the negative charge output line, and outputs negative weight charges corresponding to the multiplication value to the negative charge output line.

12. The multiply-accumulate operation device according to claim 1, wherein
the accumulation unit accumulates charges corresponding to a difference between a total amount of positive weight charges corresponding to a respective one of the multiplication values obtained by multiplying a respective one of the input values by a positive weight value and a total amount of negative weight charges corresponding to the respective one of the multiplication values obtained by multiplying the respective one of the input values by a negative weight value.

13. The multiply-accumulate operation device according to claim 12, wherein
the positive weight charges and the negative weight charges are charges with the same sign as each other, and
the accumulation unit accumulates a sum of the positive weight charges and discharge a sum of the negative weight charges.

14. The multiply-accumulate operation device according to claim 1, further comprising one or more output lines, wherein
the plurality of multiplication units is provided corresponding to the plurality of input lines, and
each of the plurality of multiplication units includes a resistor that defines a corresponding one of the weight values and has non-linear characteristics, the resistor being connected between a corresponding input line of the plurality of input lines and any one of the one or more output lines, and outputs charges corresponding to the multiplication value to the output line to which the resistor is connected.

15. The multiply-accumulate operation device according to claim 14, wherein
the resistor is a fixed resistance element, a variable resistance element, or a MOS transistor that operates in a subthreshold region.

16. A multiply-accumulate operation method, comprising:
inputting pulse signals having pulse widths corresponding to input values to a plurality of input lines;
generating, on a basis of the pulse signals input to each of the plurality of input lines, charges corresponding to multiplication values obtained by multiplying the input values by weight values;
accumulating a sum of the generated charges corresponding to the multiplication values in an accumulation unit;
charging the accumulation unit in which a sum of the charges corresponding to the multiplication values is accumulated at a charging speed associated with an accumulation state of the accumulation unit; and
outputting a multiply-accumulate signal representing a sum of the multiplication values by executing threshold determination using a threshold value associated with the accumulation state of the accumulation unit on a voltage held by the accumulation unit after the charging is started, wherein
the charging speed and the threshold value are set on a basis of an effective maximum value and an effective minimum value of the sum of the charges corresponding to the multiplication values, and
the effective maximum value and the effective minimum value are obtained from an estimation result of the sum of the charges corresponding to the multiplication values accumulated by the accumulation unit.

17. A multiply-accumulate operation device that executes a multiply-accumulate operation with an analog circuit, comprising:
a plurality of input lines, pulse signals having pulse widths corresponding to input values being input to the plurality of input lines;
a plurality of multiplication circuits that generates, on a basis of the pulse signals input to each of the plurality of input lines, charges corresponding to multiplication values obtained by multiplying the input values by weight values;
an accumulation circuit that accumulates a sum of the charges corresponding to the multiplication values generated by each of the plurality of multiplication circuits;
a charging circuit that charges, at a charging speed associated with an accumulation state of the accumulation circuit, the accumulation circuit in which the sum of the charges corresponding to the multiplication values have been accumulated; and
an output circuit that outputs a multiply-accumulate signal representing a sum of the multiplication values by executing threshold determination using a threshold value associated with the accumulation state of the accumulation circuit on a voltage held by the accumulation circuit after the charging by the charging circuit is started, wherein
the charging speed and the threshold value are set on a basis of an effective maximum value and an effective minimum value of the sum of the charges corresponding to the multiplication values, and
the effective maximum value and the effective minimum value are obtained from an estimation result of the sum of the charges corresponding to the multiplication values accumulated by the accumulation circuit.

18. A multiply-accumulate operation device that executes a multiply-accumulate operation with an analog circuit, comprising:
a plurality of input lines, pulse signals having pulse widths corresponding to input values being input to the plurality of input lines;
a plurality of multiplication circuits that generates, on a basis of the pulse signals input to each of the plurality of input lines, charges corresponding to multiplication values obtained by multiplying the input values by weight values;
an accumulation circuit that accumulates a sum of the charges corresponding to the multiplication values generated by each of the plurality of multiplication circuits;
a charging circuit that charges, at a charging speed associated with an accumulation state of the accumulation circuit, the accumulation circuit in which the sum of the charges corresponding to the multiplication values have been accumulated; and
an output circuit that outputs a multiply-accumulate signal representing a sum of the multiplication values by executing threshold determination using a threshold value associated with the accumulation state of the accumulation circuit on a voltage held by the accumulation circuit after the charging by the charging circuit is started, wherein the pulse signals are respectively input to each of the plurality of input lines within an input period having a predetermined length, the charging circuit starts the charging after the input period is ended, and the output circuit outputs the multiply-accumulate signal on a basis of timing at which the voltage held by the accumulation circuit increases or decreases over the threshold value within an output period having a predetermined length, and the pulse signals respectively have a pulse width corresponding to a period from timing corresponding to the input value in the input period to end timing of the input period.

* * * * *